United States Patent [19]

Takeda

[11] Patent Number: 5,020,082

[45] Date of Patent: May 28, 1991

[54] ASYNCHRONOUS COUNTER

[75] Inventor: Koji Takeda, Suwa, Japan

[73] Assignee: Seiko Epson Corporation, Tokyo, Japan

[21] Appl. No.: 365,583

[22] Filed: Jun. 13, 1989

[30] Foreign Application Priority Data

Jun. 15, 1988 [JP] Japan .................................. 63-147753
Jun. 30, 1988 [JP] Japan .................................. 63-162872
Aug. 10, 1988 [JP] Japan .................................. 63-199126

[51] Int. Cl.⁵ ...................... H03K 21/00; H03K 23/00
[52] U.S. Cl. .................................... 377/44; 377/47; 377/52; 377/108; 377/110
[58] Field of Search ................ 377/44, 47, 48, 52, 377/108, 110

[56] References Cited

U.S. PATENT DOCUMENTS

| | | | |
|---|---|---|---|
| 4,084,082 | 4/1978 | Alfke | 377/52 |
| 4,184,068 | 1/1980 | Washburn | 377/44 |
| 4,423,381 | 12/1983 | Stepp et al. | 377/44 |
| 4,573,176 | 2/1986 | Yeager | 377/48 |
| 4,633,194 | 12/1986 | Kikuchi et al. | 377/47 |
| 4,712,224 | 12/1987 | Nelson | 377/47 |
| 4,856,032 | 8/1989 | Klekotka et al. | 377/47 |

FOREIGN PATENT DOCUMENTS 59-15334  1/1984  Japan .
62-122325 6/1987  Japan .

OTHER PUBLICATIONS

"Ordinal Circuit Theory" by Yoshihiro Toma, Title Page and pp. 90-93 and 278 (1976).

*Primary Examiner*—John S. Heyman
*Attorney, Agent, or Firm*—Blum Kaplan

[57] ABSTRACT

An asynchronous nonlogical counting device includes at least a first counter and a second counter connected in cascade. The first counter has a frequency dividing ratio of $2^n$ where n is a natural number. A control unit produces a control signal based on the count value of the first counter. The second counter has a variable frequency dividing ratio which is based on the control signal. The counting device can be made programmable by substituting a comparator circuit for the control unit. The comparator compares the output of the first counter to an instruction signal from an external source.

42 Claims, 36 Drawing Sheets

FIG. 6(a)
(n=1)

| COUNT CONTROL FUNCTION SECTION | | PRECEDING COUNTER SECTION | |
|---|---|---|---|
| TIMES | CIRCUIT | 4/3 | 3/2 |
| 1/2 | $Q_a$ —▷— | 7-ARY | 5-ARY |
| 2/2 | HIGH ——— (ALWAYS HIGH) | 8-ARY | 6-ARY |

FIG. 6(b)
(n=2)

| COUNT CONTROL FUNCTION SECTION | | PRECEDING COUNTER SECTION | |
|---|---|---|---|
| TIMES | CIRCUIT | 4/3 | 3/2 |
| 1/4 | $Q_0, Q_1$ NAND | 13-ARY | 9-ARY |
| 2/4 | $Q_0$ —▷— | 14-ARY | 10-ARY |
| 3/4 | $Q_0, Q_1$ NAND | 15-ARY | 11-ARY |
| 4/4 | HIGH ——— (ALWAYS HIGH) | 16-ARY | 12-ARY |

FIG. 6(c)
(n=3)

| COUNT CONTROL FUNCTION SECTION | | PRECEDING COUNTER SECTION | |
|---|---|---|---|
| TIMES | CIRCUIT | 4/3 | 3/2 |
| 1/8 | $Q_0, Q_1, Q_2$ NAND | 25-ARY | 17-ARY |
| 2/8 | $Q_0, Q_1$ NAND | 26-ARY | 18-ARY |
| 3/8 | $Q_0, Q_1, Q_2$ NAND | 27-ARY | 19-ARY |
| 4/8 | $Q_0$ —▷— | 28-ARY | 20-ARY |
| 5/8 | $Q_0, Q_1, Q_2$ NAND | 29-ARY | 21-ARY |
| 6/8 | $Q_0, Q_1$ NAND | 30-ARY | 22-ARY |
| 7/8 | $Q_0, Q_1, Q_2$ NAND | 31-ARY | 23-ARY |
| 8/8 | HIGH ——— (ALWAYS HIGH) | 32-ARY | 24-ARY |

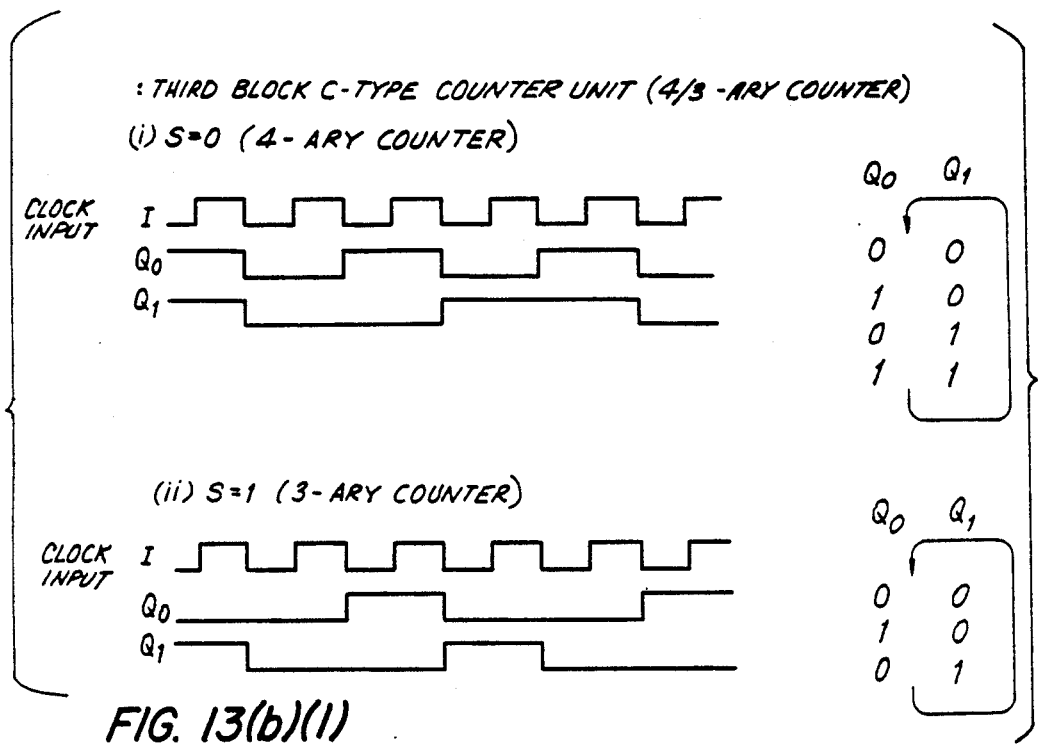
FIG. 13(b)(1)
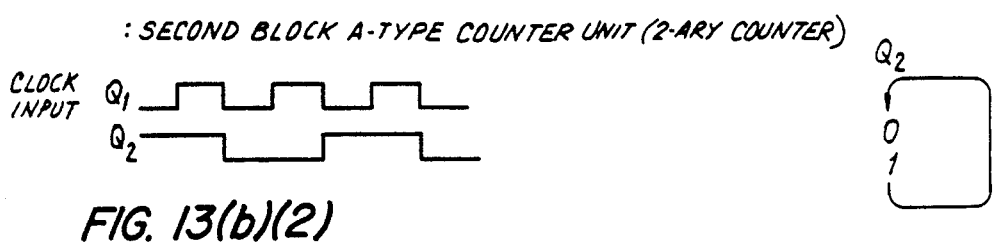
FIG. 13(b)(2)
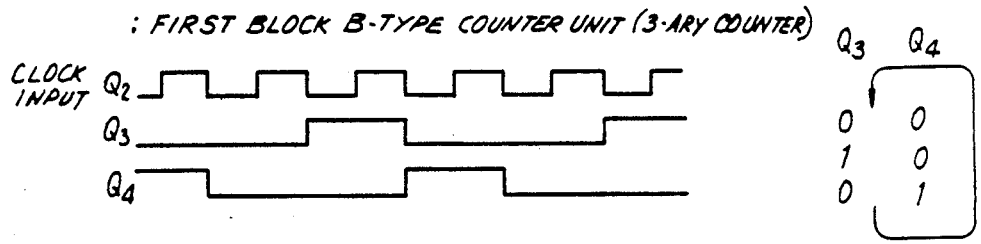
FIG. 13(b)(3)

|      | $Q_0$ | $Q_1$ | $Q_2$ | $Q_3$ | $Q_4$ |
|------|-------|-------|-------|-------|-------|
| $T_0$  | 0 | 0 | 0 | 0 | 0 |
| $T_1$  | 1 | 0 | 0 | 0 | 0 |
| $T_2$  | 0 | 1 | 0 | 0 | 0 |
| $T_3$  | 1 | 1 | 0 | 0 | 0 |
| $T_4$  | 0 | 0 | 1 | 0 | 0 |
| $T_5$  | 1 | 0 | 1 | 0 | 0 |
| $T_6$  | 0 | 1 | 1 | 0 | 0 |
| $T_7$  | 1 | 1 | 1 | 0 | 0 |
| $T_8$  | 0 | 0 | 0 | 1 | 0 |
| $T_9$  | 1 | 0 | 0 | 1 | 0 |
| $T_{10}$ | 0 | 1 | 0 | 1 | 0 |
| $T_{11}$ | 1 | 1 | 0 | 1 | 0 |
| $T_{12}$ | 0 | 0 | 1 | 1 | 0 |
| $T_{13}$ | 1 | 0 | 1 | 1 | 0 |
| $T_{14}$ | 0 | 1 | 1 | 1 | 0 |
| $T_{15}$ | 1 | 1 | 1 | 1 | 0 |
| $T_{16}$ | 0 | 0 | 0 | 0 | 1 |
| $T_{17}$ | 1 | 0 | 0 | 0 | 1 |
| $T_{18}$ | 0 | 1 | 0 | 0 | 1 |
| $T_{19}$ | 1 | 1 | 0 | 0 | 1 |
| $T_{20}$ | 0 | 0 | 1 | 0 | 1 |
| $T_{21}$ | 1 | 0 | 1 | 0 | 1 |
| $T_{22}$ | 0 | 1 | 1 | 0 | 1 |

FIG. 13(c)

FIG. 14(a)(1)
: A-TYPE COUNTER UNIT (2-ARY COUNTER)
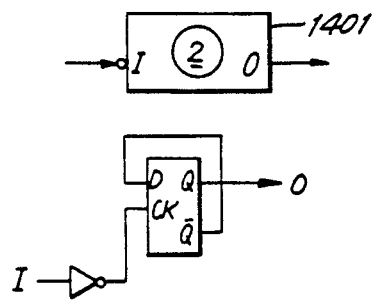
FIG. 14(a)(2)
: B-TYPE COUNTER UNIT ($2^{n-1}+1$)-ARY COUNTER)
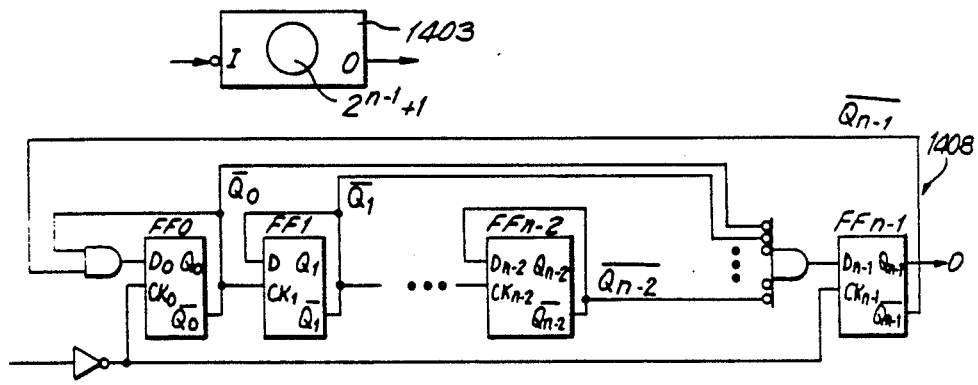
FIG. 14(a)(3)
: C-TYPE COUNTER UNIT ($2^n/2^{n-1}+1$)-ARY COUNTER
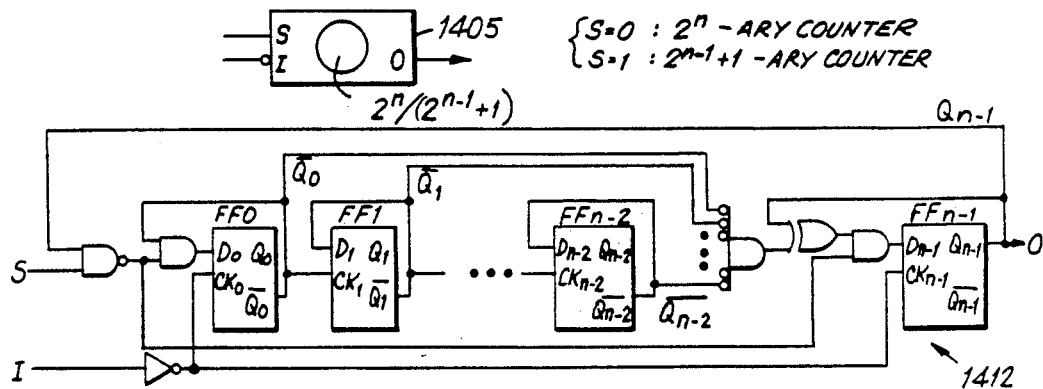
$\begin{cases} S=0 : 2^n\text{-ARY COUNTER} \\ S=1 : 2^{n-1}+1\text{-ARY COUNTER} \end{cases}$

|  | $Q_0$ | $Q_1$ | $Q_2$ | $\cdots$ | $Q_{n-2}$ | $Q_{n-1}$ |
|---|---|---|---|---|---|---|
| $T_0$ | 0 | 0 | 0 | $\cdots$ | 0 | 0 |
| $T_1$ | 1 | 0 | 0 | $\cdots$ | 0 | 0 |
| $T_2$ | 0 | 1 | 0 | $\cdots$ | 0 | 0 |
| $\vdots$ | | | | | | |
| $T_{2^{n-1}-1}$ | 1 | 1 | 1 | $\cdots$ | 1 | 0 |
| $T_{2^n-1}$ | 0 | 0 | 0 | $\cdots$ | 0 | 1 |

FIG. 14(b)

$S=0$ ($2^n$-ARY COUNTER)

| | $Q_0$ | $Q_1$ | $Q_2$ | $\cdots$ | $Q_{n-2}$ | $Q_{n-1}$ |
|---|---|---|---|---|---|---|
| $T_0$ | 0 | 0 | 0 | $\cdots$ | 0 | 0 |
| $T_1$ | 1 | 0 | 0 | $\cdots$ | 0 | 0 |
| $T_2$ | 0 | 1 | 0 | $\cdots$ | 0 | 0 |
| $\vdots$ | | | $\vdots$ | | | |
| $T_{2^n-1}$ | 1 | 1 | 1 | | 1 | 1 |

FIG. 14(c)(1)

$S=1$ ($2^{n-1}+1$-ARY COUNTER)

| | $Q_0$ | $Q_1$ | $Q_2$ | $\cdots$ | $Q_{n-2}$ | $Q_{n-1}$ |
|---|---|---|---|---|---|---|
| $T_0$ | 0 | 0 | 0 | $\cdots$ | 0 | 0 |
| $T_1$ | 1 | 0 | 0 | $\cdots$ | 0 | 0 |
| $T_2$ | 0 | 1 | 0 | $\cdots$ | 0 | 0 |
| $\vdots$ | | | $\vdots$ | | | |
| $T_{2^{n-1}-1}$ | 1 | 1 | 1 | $\cdots$ | 1 | 0 |
| $T_{2^{n-1}}$ | 0 | 0 | 0 | $\cdots$ | 0 | 1 |

FIG. 14(c)(2)

3-ARY COUNTER (n=2)

5-ARY COUNTER (n=3)

FIG. 17(b)
(8) 9-ARY COUNTER 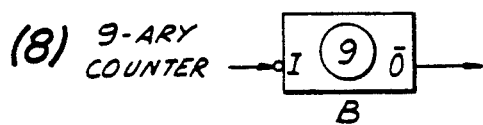
(9) 10-ARY COUNTER 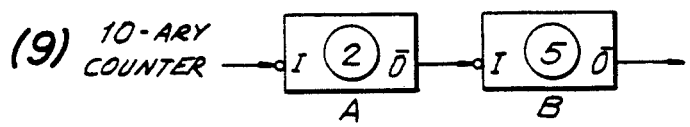
(10) 11-ARY COUNTER 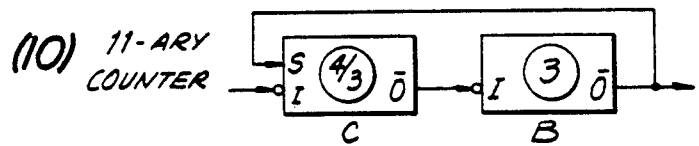
(11) 12-ARY COUNTER 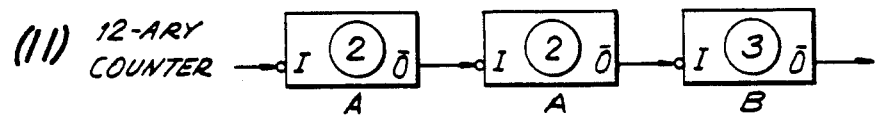
(12) 13-ARY COUNTER 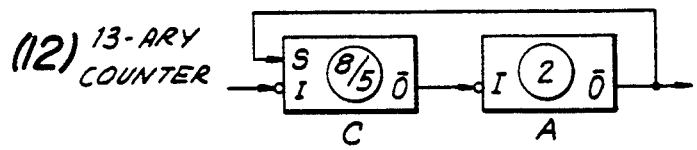
(13) 14-ARY COUNTER 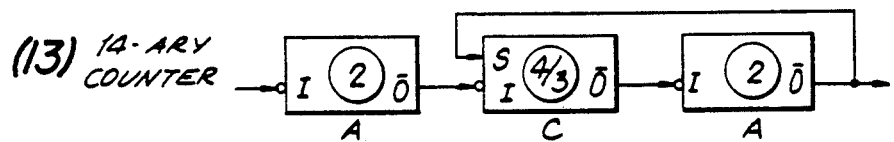
(14) 15-ARY COUNTER 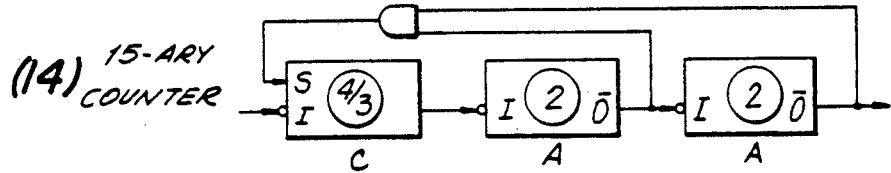
(15) 16-ARY COUNTER 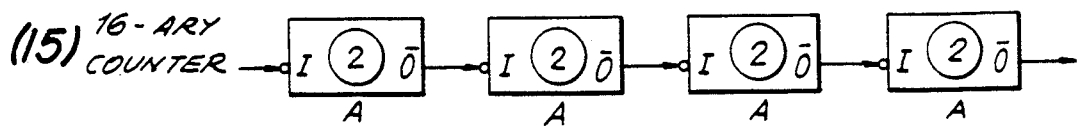

FIG. 17(c)
(16) 17-ARY COUNTER 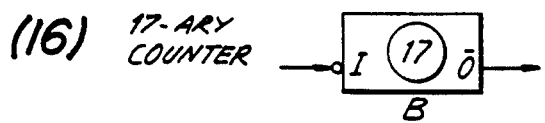
(17) 18-ARY COUNTER 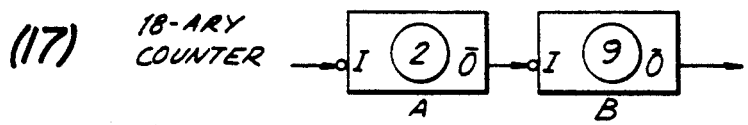
(18) 19-ARY COUNTER 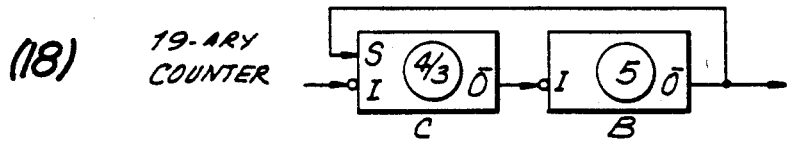
(19) 20-ARY COUNTER 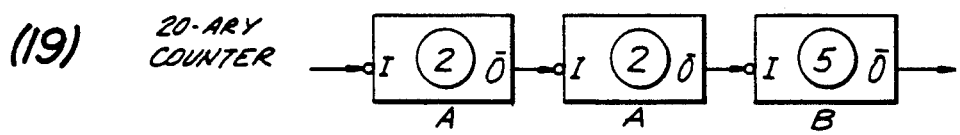
(20) 21-ARY COUNTER 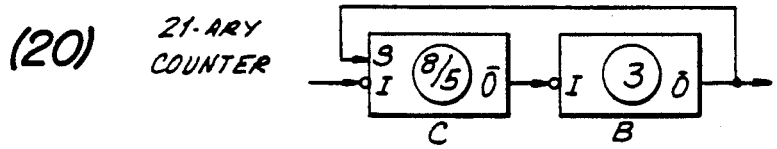
(21) 22-ARY COUNTER 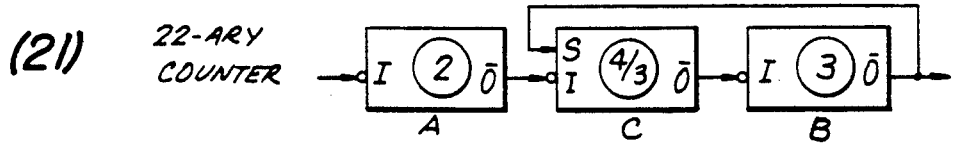
(22) 23-ARY COUNTER 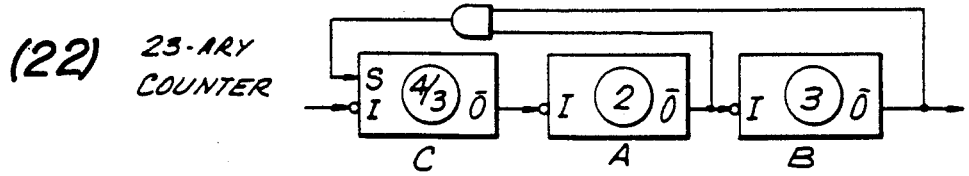
(23) 24-ARY COUNTER 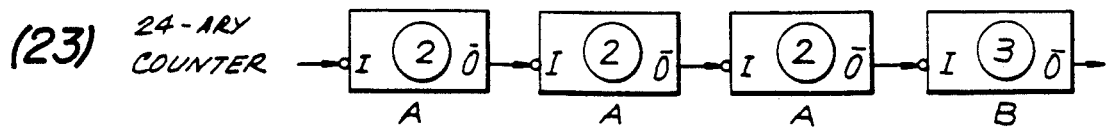

FIG. 18(a)

| N-ARY COUNTER | BINARY EXPANSION OF N-1 $Q_0$ $Q_1$ $Q_2$ $Q_3$ $Q_4$ | COUNTER'S COMPOSITION (GROUPED INTO:) | | | | | THE NUMBER OF GATES | |
|---|---|---|---|---|---|---|---|---|
| | | 1ST BLOCK | 2ND BLOCK | 3RD BLOCK | 4TH BLOCK | 5TH BLOCK | PRESENT INVENTION | PRIOR ART |
| 2 | 1 | 2 (A) | | | | | 6 | 6 |
| 3 | 0 1 | 3 (B) | | | | | 13 | 13 |
| 4 | 1 1 | 2 (A) | 2 (A) | | | | 12 | 15 |
| 5 | 0 0 1 | 5 (B) | | | | | 20 | 23 |
| 6 | 1 0 1 | 2 (A) | 3 (B) | | | | 19 | 28 |
| 7 | 0 1 1 | 4/3 (C) | 2 (A) | | | | 24 | 29 |
| 8 | 1 1 1 | 2 (A) | 2 (A) | 2 (A) | | | 18 | 25 |
| 9 | 0 0 0 1 | 9 (B) | | | | | 27 | 34 |
| 10 | 1 0 0 1 | 2 (A) | 5 (B) | | | | 26 | 39 |
| 11 | 0 1 0 1 | 4/3 (C) | 3 (B) | | | | 31 | 40 |
| 12 | 1 1 0 1 | 2 (A) | 2 (A) | 3 (B) | | | 25 | 40 |
| 13 | 0 0 1 1 | 8/5 (C) | 2 (A) | | | | 31 | 40 |
| 14 | 1 0 1 1 | 2 (A) | 4/3 (C) | 2 (A) | | | 30 | 41 |
| 15 | 0 1 1 1 | 4/3 (C) | 2 (A) | 2 (A) | | | 31 | 42 |
| 16 | 1 1 1 1 | 2 (A) | 2 (A) | 2 (A) | 2 (A) | | 24 | 36 |

FIG. 18(b)

| N-ARY COUNTER | BINARY EXPANSION OF N-1 | | | | | COUNTER'S COMPOSITION (GROUPED INTO:) | | | | | THE NUMBER OF GATES | |
|---|---|---|---|---|---|---|---|---|---|---|---|---|
| | Q0 | Q1 | Q2 | Q3 | Q4 | 1ST BLOCK | 2ND BLOCK | 3RD BLOCK | 4TH BLOCK | 5TH BLOCK | PRESENT INVENTION | PRIOR ART |
| 17 | 0 | 0 | 0 | 0 | 1 | 17 (B) | | | | | 33 | 45 |
| 18 | 1 | 0 | 0 | 0 | 1 | 2 (A) | 9 (B) | | | | 33 | 50 |
| 19 | 0 | 1 | 0 | 0 | 1 | 4/3 (C) | 5 (B) | | | | 38 | 51 |
| 20 | 1 | 1 | 0 | 0 | 1 | 2 (A) | 2 (A) | 5 (B) | | | 32 | 51 |
| 21 | 0 | 0 | 1 | 0 | 1 | 8/5 (C) | 3 (B) | | | | 38 | 51 |
| 22 | 1 | 0 | 1 | 0 | 1 | 2 (A) | 4/3 (C) | 3 (B) | | | 37 | 52 |
| 23 | 0 | 1 | 1 | 0 | 1 | 4/3 (C) | 2 (A) | 3 (B) | | | 38 | 53 |
| 24 | 1 | 1 | 1 | 0 | 1 | 2 (A) | 2 (A) | 2 (A) | 3 (B) | | 31 | 51 |
| 25 | 0 | 0 | 0 | 1 | 1 | 16/9 (C) | 2 (A) | | | | 38 | 51 |
| 26 | 1 | 0 | 0 | 1 | 1 | 2 (A) | 8/5 (C) | 2 (A) | | | 37 | 52 |
| 27 | 0 | 1 | 0 | 1 | 1 | 4/3 (C) | 4/3 (C) | 2 (A) | | | 43 | 53 |
| 28 | 1 | 1 | 0 | 1 | 1 | 2 (A) | 2 (A) | 4/3 (C) | 2 (A) | | 36 | 52 |
| 29 | 0 | 0 | 1 | 1 | 1 | 8/5 (C) | 2 (A) | 2 (A) | | | 38 | 53 |
| 30 | 1 | 0 | 1 | 1 | 1 | 2 (A) | 4/3 (C) | 2 (A) | 2 (A) | | 37 | 53 |
| 31 | 0 | 1 | 1 | 1 | 1 | 4/3 (C) | 2 (A) | 2 (A) | 2 (A) | | 38 | 54 |
| 32 | 1 | 1 | 1 | 1 | 1 | 2 (A) | 2 (A) | 2 (A) | 2 (A) | | 30 | 47 |

ASYNCHRONOUS COUNTER

BACKGROUND OF THE INVENTION

This invention relates generally to a counter, and more particularly to an asynchronous type counter.

Counters are generally classified as either synchronous or asynchronous. As shown in FIG. 21(a), a conventional synchronous counter 2100 includes two or more flip-flops (FF's) in which the clock terminals of each flip-flop are connected to a common clock input. FIG. 21(b) illustrates a conventional asynchronous counter 2150 in which a clock terminals of at least one of the flip-flops is not connected to the clock terminals of any of the other flip-flops. Asynchronous counter 2150 is also commonly referred to as a ripple counter, that is, the clock is derived from a previous stage output.

Synchronous counter 2100 can assume sixteen different values (i.e., a 16-ary counter). Asynchronous counter 2150 has a far simpler circuit configuration and requires far fewer transistors than synchronous counter 2100. Asynchronous counter 2150 can assume $2^n$ values (i.e., $2^n$-ary counter). Until recently, asynchronous type counters functioning as other than a $2^n$-ary counter were not commonly used.

A conventional synchronous counter 2200 and a conventional asynchronous counter 2250 functioning as other than $2^n$-ary counters are shown in FIGS. 22(a) and 22(b), respectively. Counters 2200 and 2250 are each 13-ary counters (i.e., can assume 13 different values). Asynchronous counter 2250, which resets the first four counters when the Q output of the fifth counter is at a low logic level, requires far fewer transistors than synchronous counter 2200. Far more transistors, however, are required by asynchronous counter 2250 than are used in the 16-ary asynchronous counter 2150. In particular, a conventional asynchronous counter functioning as other than a $2^n$-ary counter requires far too many transistors. Furthermore, since the manufacturing cost of the counter is proportional to the number of gates required by a counter, the manufacturing cost of an asynchronous counter is far too expensive.

Accordingly, it is desirable to provide an asynchronous counter which requires far fewer transistors and therefore is less costly to manufacture than a conventional asynchronous counter in producing other than $2^n$ count values.

SUMMARY OF THE INVENTION

Generally speaking, in accordance with the invention, an asynchronous, nonlogical counter includes a preceding counter unit characterized by a frequency dividing ratio and operable for receiving a first clock signal and for producing a first output signal based on the frequency dividing ratio. The counter also includes a succeeding counter unit characterized by an additional frequency dividing ratio $2^n$ and operable for receiving a second clock signal based on the first output signal and for producing a second output signal based on the additional frequency dividing ratio wherein n is a non-negative integer or a natural number. The succeeding counter unit includes n flip-flops. The counter also includes a control unit or a comparator for producing a control signal based on the second output signal. The preceding counter unit is responsive to the control signal for varying its frequency dividing ratio.

The counter when constructed with a comparator can be used in combination with an external instruction source. The external instruction source produces an instructing signal. The preceding counter unit is then responsive to both a portion of the instructing signal and control signal for varying its frequency dividing ratio. In particular, the instructing signal includes $n+1$ bits. The preceding counter unit is responsive to the highest order bit of the instructing signal for varying its frequency dividing ratio. By substituting the comparator, which compares all but the highest order bit of the instructing signal to the second output signal, the counter becomes programmable.

In one preferred embodiment of the invention, the counter further includes at least one additional succeeding counter unit. Each additional succeeding counter unit produces an additional output signal wherein the control unit produces its control signal based on the second output signal and each additional output signal.

In another preferred embodiment of the invention, the preceding counter unit includes logic circuitry for varying its frequency dividing ratio between $\frac{1}{3}$ and $\frac{1}{4}$ based on the control signal or, alternatively, between $\frac{1}{3}$ and $\frac{1}{4}$ based on the control signal and the instructing signal.

In another alternative embodiment of the invention, the logic circuitry varies the frequency dividing ratio between $\frac{1}{2}$ and $\frac{1}{3}$ based on the control signal or, alternatively, between $\frac{1}{2}$ and $\frac{1}{3}$ based on the control signal and the instructing signal.

In another alternative embodiment of the invention, an asynchronous logical counting device includes at least two counters connected in cascade. Each counter is selected from a group consisting of an A-type unit, a B-type unit and a C-type unit. The A-type unit includes an input and an output and is characterized by a frequency dividing ratio of 2. The B-type unit includes an input and an output and is characterized by a frequency dividing ratio of $(2^{n-1}+1)$ where n is an integer equal to or greater than 2. The C-type unit includes an input and an output and is characterized by a frequency dividing ratio which varies between $(2^{n-1}+1)$ and $2^n$. The device further includes an AND gate for each C-type unit. Each AND gate produces a control signal. Each C-type unit is responsive to the control signal produced by the associated AND gate for varying the frequency dividing ratio between $(2^{n-1}+1)$ and $2^n$. The input of each unit is connected to the output of the preceding unit. The control signal produced by each AND gate is based on the outputs of each unit which follows (succeeds) the associated C-type unit.

Accordingly, it is an object of the invention to provide an improved asynchronous nonlogical counter which functions as other than a $2^n$-ary counter.

It is another object of the invention to provide an improved asynchronous counter which requires substantially fewer transistors than a conventional asynchronous counter.

It is a further object of the invention to provide an asynchronous counter which has a lower manufacturing cost than a conventional asynchronous counter.

Still other objects and advantages of the invention will in part be obvious and will in part be apparent from the specification.

The invention accordingly comprises the several steps and the relation of one or more of such steps with respect to each of the others, and the apparatus embodying features of construction, combinations of elements and arrangements of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 4-2(a), 4-2(b), 4-2(c), 4-2(d) 4-2(e) and 4-2(f) are logic circuits of the preceding counter section in accordance with additional alternative embodiments of the invention;

FIGS. 6(a), 6(b) and 6(c) are tabular illustrations of the count control function section of FIG. 1 in accordance with alternative embodiments of the invention;

FIGS. 7-1, 7-2, 7-3 and 7-4 are logic circuits of the counter of FIG. 1 in accordance with still other alternative embodiments of the invention;

FIGS. 8-1, 8-2, 8-3 and 8-4 are logic circuits of FIG. 1 in accordance with still further alternative embodiments of the invention;

FIGS. 13(b)(1), 13(b)(2) and 13(b)(3) are timing diagrams of the counter units of FIG. 13(a);

FIG. 13(c) is a tabular illustration of the outputs assumed by the counter units of FIG. 13(a);

FIGS. 14(a)(1), 14(a)(2) and 14(a)(3) are equivalent logic circuits and corresponding symbolic block diagrams of the counter units of FIG. 13(a);

FIG. 14(b) is a tabular illustration of the outputs assumed by the B-type counter unit of FIG. 14(a)(2);

FIGS. 14(c)(1), 14(c)(2) and 14(c)(3) are tabular illustrations of the outputs assumed by the C-type counter unit of FIG. 14(a)(3);

FIGS. 17(a), 17(b), 17(c) and 17(d) are symbolic block diagrams combined to form further alternative embodiments of the invention;

FIGS. 18(a) and 18(b) are tabular illustrations comparing the counters of FIGS. 17(a), 17(b), 17(c) and 17(d) to conventional asynchronous counters;

DESCRIPTION OF THE PREFERRED EMBODIMENTS

Counters in which flip-flops are connected to each other such that the binary output value of the counter increases sequentially for each clock pulse inputted to the counter (i.e. increasing by the decimal equivalent of 0, 1, 2, . . . ) are commonly referred to as a logical type counter. Counters in which flip-flops are connected to each other such that the binary output value of the counter does not increase sequentially for each clock pulse inputted to the counter (i.e. does not increase by the decimal equivalent of 0, 1, 2, . . . ) are commonly referred to as nonlogical type counters. For example, a logical type counter which can assume eight different values (i.e., 8-ary counter) incrementally increases its binary value as follows: (000)→(001)→(010)→(011)→(100)→(101)→(110)→(111)→(000). A nonlogical type counter assuming eight different values would not follow the foregoing binary pattern of outputs. In accordance with the invention, to minimize the number of transistors required for a counter, it is preferable to use only asynchronous, nonlogical type counters.

Figure 1:
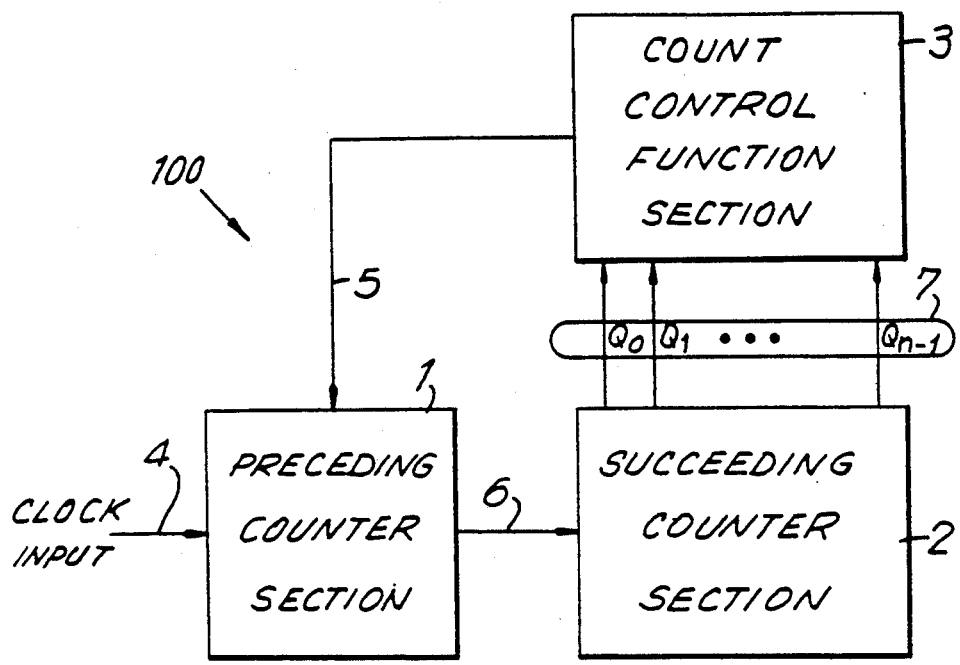
FIG. 1 is a block diagram of an asynchronous counter in accordance with one embodiment of the invention.

As shown in FIG. 1, a counter 100 in accordance with a first embodiment of the invention includes a preceding counter section 1 having an output 6 which is connected to the input of a succeeding counter section 2. An output 7 of succeeding counter section 2 is supplied to a count control function section 3. A control signal 5, which is produced by count control function section 3, is provided to preceding counter section 1. Preceding counter section 1, which also includes a clock input 4, has at least two frequency dividing (i.e. demultiplication) ratios which are based on control signal 5.

Preceding counter section 1 can assume, for example, X different values (i.e., X-ary counter) when control signal 5 is at a high logic level. Preceding counter section 1 also can assume, for example, Y different values (i.e., Y-ary counter) when control signal 5 is at a low logic level. Succeeding counter section 2 is a $2^n$-ary counter which includes n flip-flops. Output 6 of preceding counter section 1 serves as the clock input to succeeding counter section 2. Output signal 7, represented by n outputs ($Q_0$ $Q_1$, . . . $Q_{n-1}$) of succeeding counter section 2, is supplied to the input of count control function section 3. Control signal 5 produced by count control function section 3 is based on output 7.

Output 7 of succeeding counter section 2 produces $2^n$ combinations of outputs. For explanatory purposes only, assume that x combinations of output 7 result in control signal 5 assuming a high logic level. The remaining y combinations of output 7 ($y=2^n-x$) produced by succeeding counter section 2 result in control signal 5 assuming a low logic level. Therefore, preceding counter section 1 is an X-ary counter x times and a Y-ary counter y times. In other words, preceding counter section 1 can assume X different values x times and Y different values y times. Therefore, counter 100 can assume a total of $(x \times X + y \times Y)$ different values (i.e., $(x \times X + y \times Y)$-ary counter). Any desired frequency dividing ratio can be obtained by selecting suitable values of X, Y and x.

Figure 2:
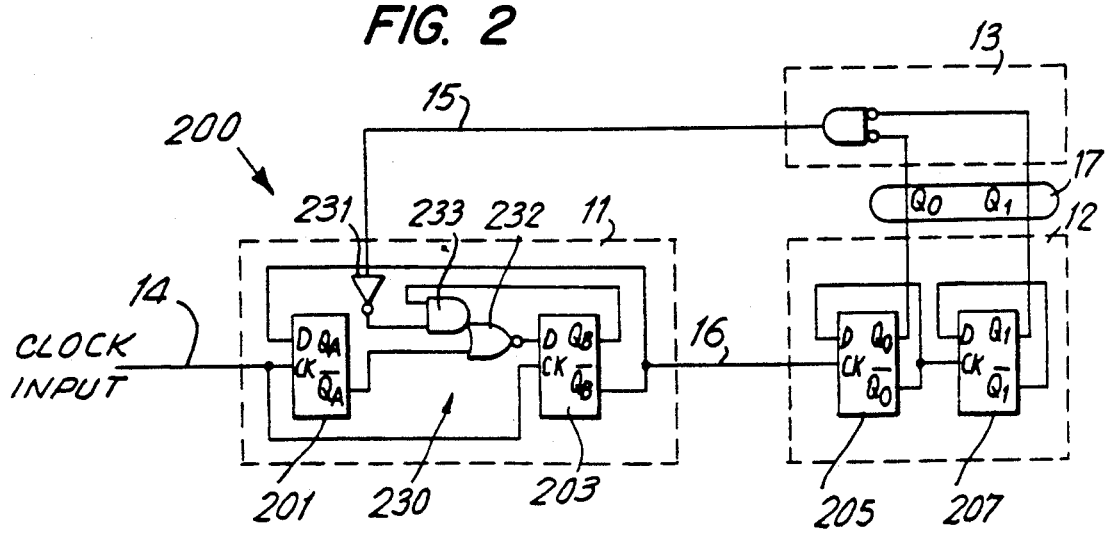
FIG. 2 is a logic circuit of the asynchronous counter of FIG. 1.

In accordance with a first embodiment of counter 100, FIG. 2 illustrates a counter 200 which can assume thirteen different values (i.e., 13-ary counter). Counter 200 includes a preceding counter section 11 having a clock input 14, an output 16 which is supplied as a clock input to a succeeding counter section 12 and a gate circuit 230. Circuit 230 includes an inverter 231, a NOR gate 232 and an AND gate 233. An output $Q_B$ of a flip-flop 203 and the output of inverter 231 are supplied as inputs to AND gate 233. An output $Q_A$ of a flip-flop 201 and the output of AND gate 233 are supplied as inputs to NOR gate 232. The output of NOR gate 232 is supplied to a D terminal of flip-flop 203. A count control function circuit 13 receives at its input an output signal 17 produced by succeeding counter section 12. A control signal 15, which is produced by count control function circuit 13, is supplied to preceding counter section 11 for controlling the frequency dividing ratio of preceding counter section 11. When control signal 15 is at high and low logic levels, preceding counter section 11 functions as a 4-ary counter and as a 3-ary counter, respectively.

Figure 3A:
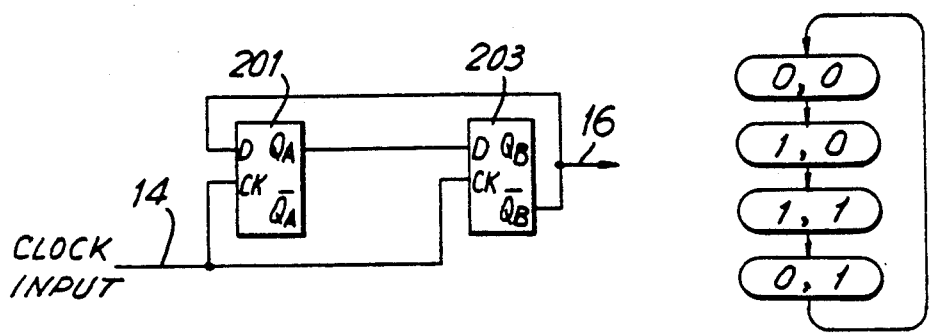
FIGS. 3(a) and 3(b) are equivalent logic circuits of a preceding counter section of FIG. 2.

FIG. 3(a) illustrates the equivalent circuit for preceding counter section 11 when control signal 15 is at a high logic level. For each clock pulse received by clock input 14, an output $Q_A$ of flip-flop 201 and an output 213 of flip-flop 203 of preceding counter section 11 assume values $(Q_A, Q_B)$ as follows: $(0, 0) \rightarrow (1,0) \rightarrow (1,1) \rightarrow (0,1)$. This sequence of $(Q_A, Q_B)$ is repeated thereafter.

Succeeding counter section 12 of FIG. 2 is a 4-ary ripple counter and includes two flip-flops 205 and 207. When an output $Q_0$ of flip-flop 205 and an output of $Q_1$ of flip-flop 207 are both at low logic levels, control signal 15 assumes a high logic level resulting in the equivalent logic circuit of FIG. 3(a). When $(Q_1, Q_0) = (0,1)$, $(1,0)$, or $(1,1)$, control signal 15 assumes a low logic level.

Figure 3B:
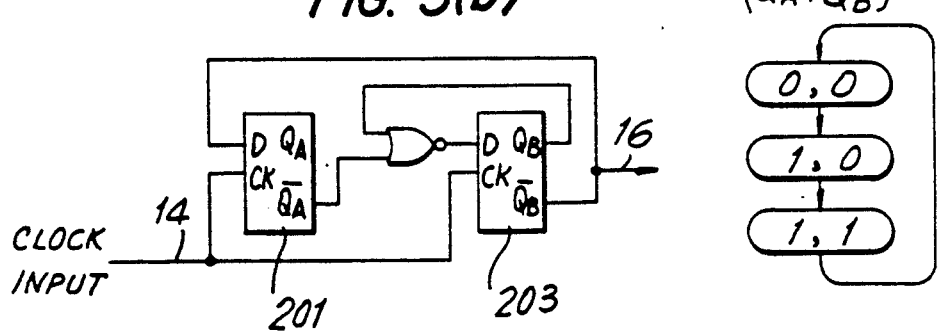

When control signal 15 is at a low logic level, preceding counter section 11 functions as a 3-ary counter. In other words, preceding counter section 1 can assume three different values when the three different values of output signal 17 referred to above and applied. FIG. 3(b) illustrates the equivalent logic circuit and sequence of outputs of preceding counter section 11 when control signal 15 is at a low logic level.

The outputs of flip-flops 207, 205, 203 and 201 ($Q_1$, $Q_0$, $Q_B$, $Q_A$) change for each clock pulse received at clock input 14 as follows: $(0,0,0,0) \rightarrow (0,0,0,1) \rightarrow (0,0,1,1) \rightarrow (0,0,1,0) \rightarrow (0,1,0,0) \rightarrow (0,1,0,1) \rightarrow (0,1,1,1) \rightarrow (1,0,0,0) \rightarrow (1,0,0,1) \rightarrow (1,0,1,1) \rightarrow (1,1,0,0) \rightarrow (1,1,0,1) \rightarrow (1,1,1,1,) \rightarrow (0,0,0,0)$. Therefore, counter 200 functions as a nonlogical type counter and can assume 13 different values, (i.e., $(1 \times 4)+(3 \times 3)$), that is, counter 200 functions as a 13-ary, nonlogical type counter.

Figure 3C:
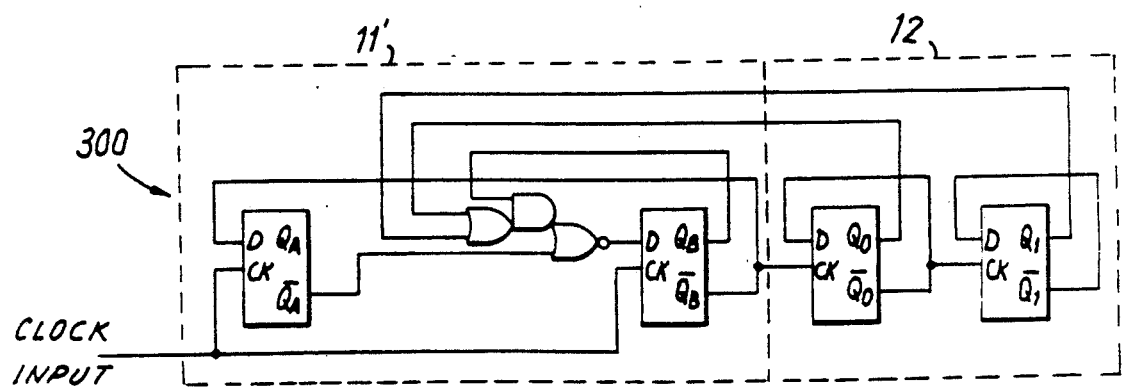
FIG. 3(c) is a logic circuit of the counter of FIG. 1 in accordance with an alternative embodiment of the invention.
Figure 22A:
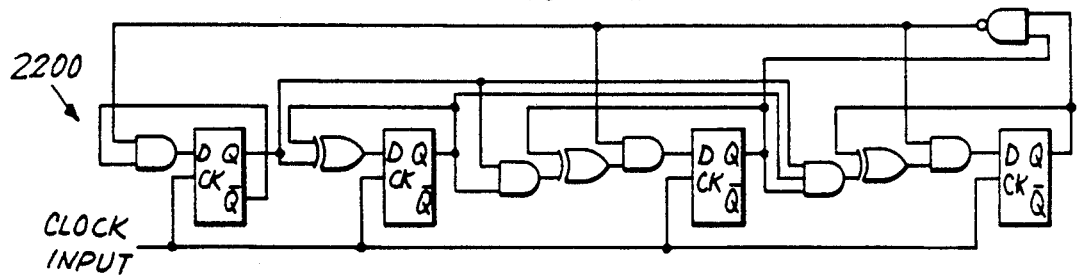
FIGS. 22(a) and 22(b) are logic circuits of another conventional synchronous counter and another conventional asynchronous counter.
Figure 22B:
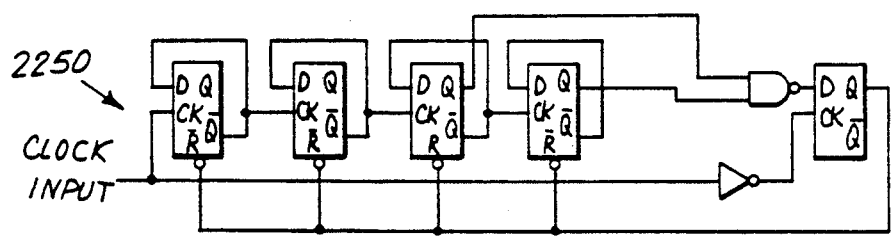

In accordance with a second embodiment of counter 100, FIG. 3(c) illustrates a counter 300 which includes a preceding counter section 11' and succeeding counter section 12. Counter 300 incorporates count control function section 13 of counter 200 within preceding counter section 11'. Operation of counter 300 is substantially the same as counter 200. As compared to asynchronous counter 2250 of FIG. 22(b), far fewer transistors are required by counter 300. For example, assuming that counter 2250 requires 14 transistors for flip-flops with reset, 12 transistors for flip-flops without reset and four 2-input NAND gates, 71 transistors are required by counter 2250. Counter 300, however, requires only 52 transistors. A reduction of over 25% is attained by using counter 300 compared to conventional asynchronous counter 2250.

Counter 200 of FIG. 2 functions as a 13-ary counter since control signal 15 assumes a high logic level for only one value of output 17 (i.e., $Q_0 = Q_1 = 0$). By changing the logic circuitry of count control function section 13, however, so that output 15 assumes a high logic level for 2, 3 or all 4 output values, counter 200 can function as a 14-ary, 15-ary or 16-ary counter, respectively. Furthermore, although preceding counter section 11 functions as either a 4-ary and 3-ary counter depending on the logic level of control signal 15, preceding counter section 11 can be designed using well known logic circuitry to switch between a 3-ary counter and a 2-ary counter. Consequently, by modifying count control function section 13 so as to produce a high logic level for either 1, 2, 3 or all 4 values of output 17, counter 200 can function as a 9-ary, 10-ary, 11-ary or 12-ary counter, respectively.

Figures 1A, 4:
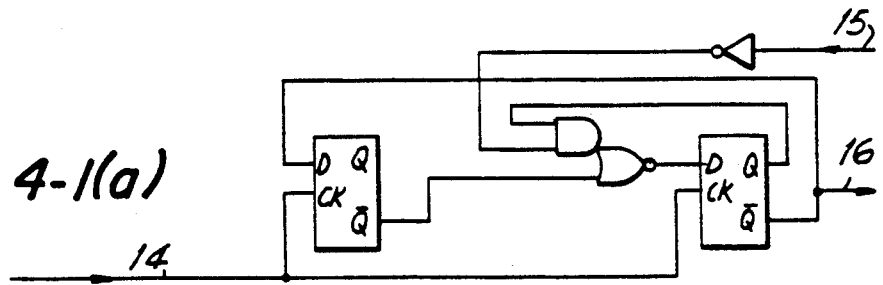
FIGS. 4-1(a), 4-1(b), 4-1(c), 4-1(d) and 4-1(f) are logic circuits of the preceding counter section in accordance with other alternative embodiments of the invention.
Figures 1B, 4:
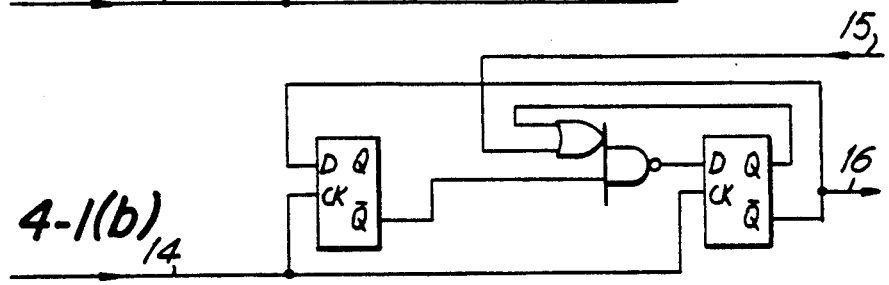
Figures 1C, 4:
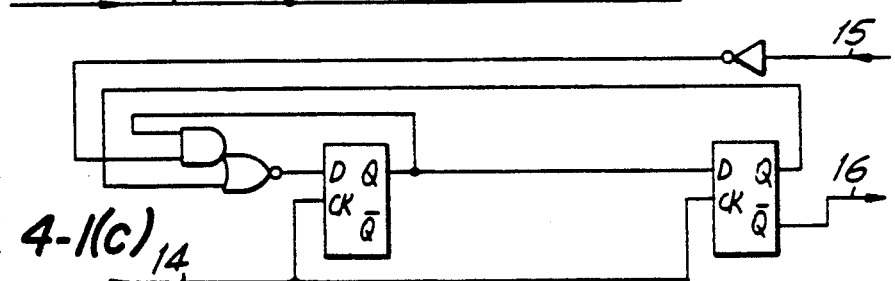
Figures 1D, 4:
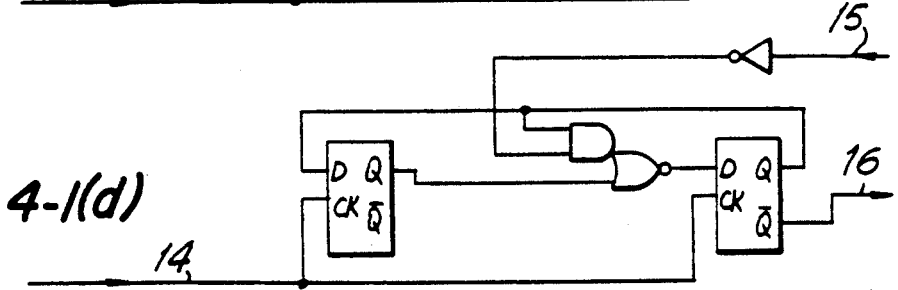
Figures 1E, 4:
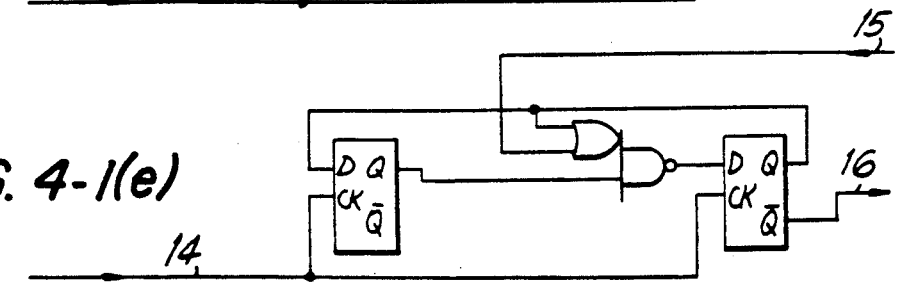
Figures 1F, 4:
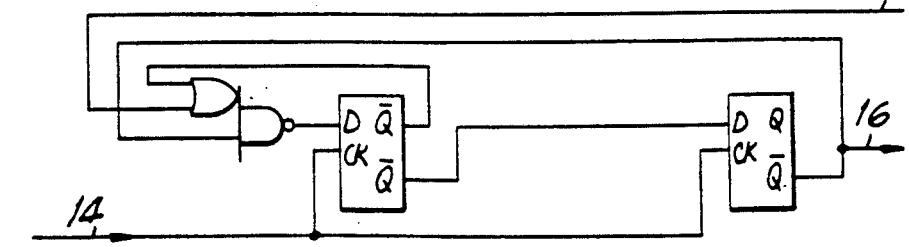
Figures 2A, 4:
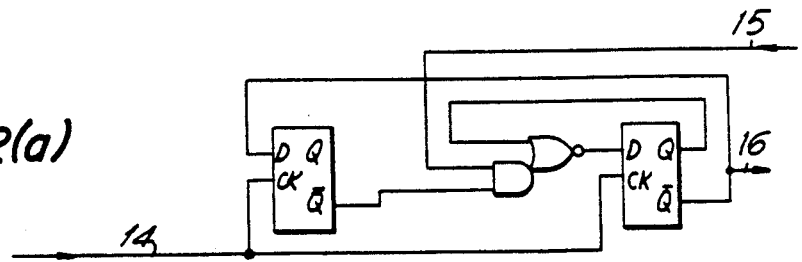
Figures 2B, 4:
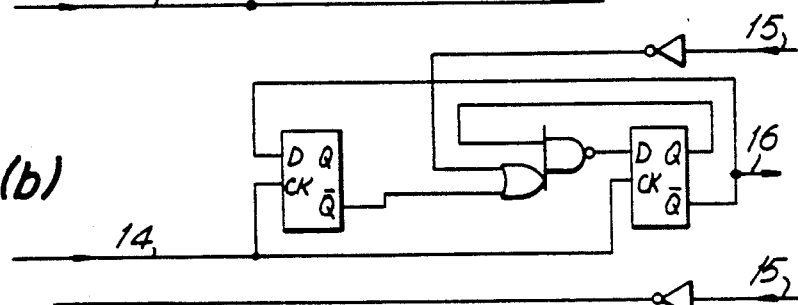
Figures 2C, 4:
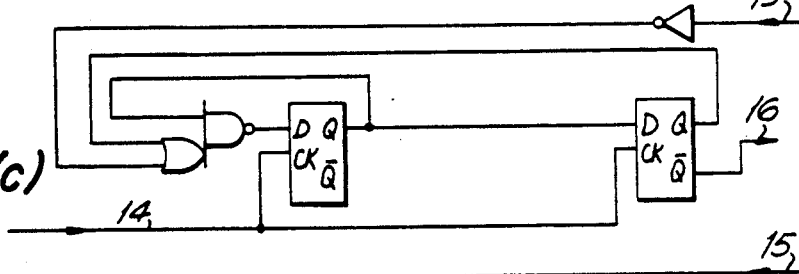
Figures 2D, 4:
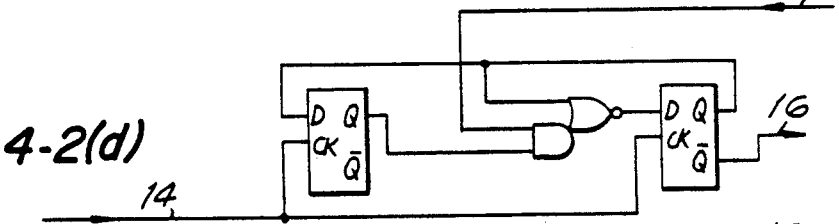
Figures 2E, 4:
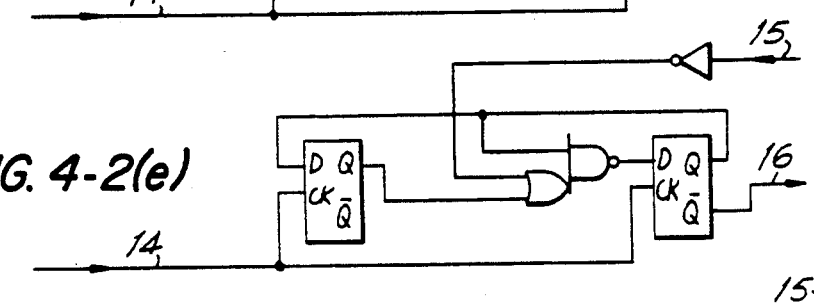
Figures 2F, 4:
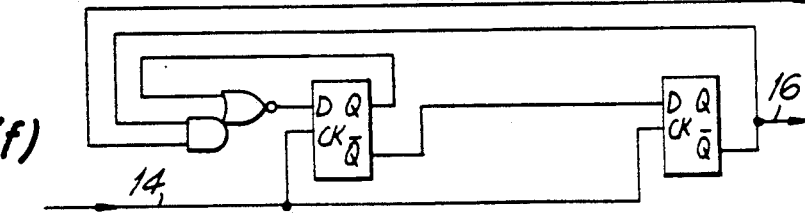

FIGS. 4-1(a)–4-1(f) illustrate alternative embodiments of preceding counter section 11 in accordance with the invention. Each of these alternative embodiments of preceding counter section 11 functions as a 4-ary counter and a 3-ary counter when control signal 15 assumes a high logic level and a low logic level, respectively. FIGS. 4-2(a)–4-2(f) illustrate alternative embodiments of preceding counter section 11 which functions as 3-ary counter and 2-ary counter when control signal 15 is at a high logic level and a low logic level, respectively.

Figure 5A:
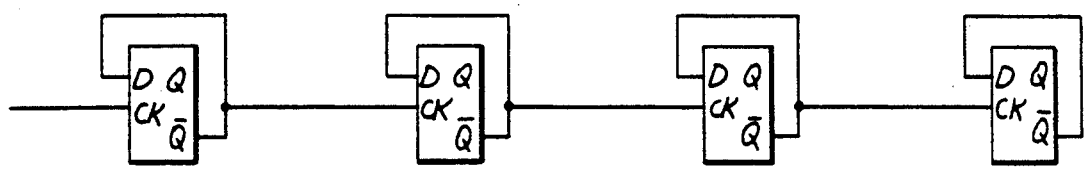
FIGS. 5(a), 5(b) and 5(c) are logic circuits of the succeeding counter section of FIG. 1 in accordance with alternative embodiments of the invention.
Figure 5B:
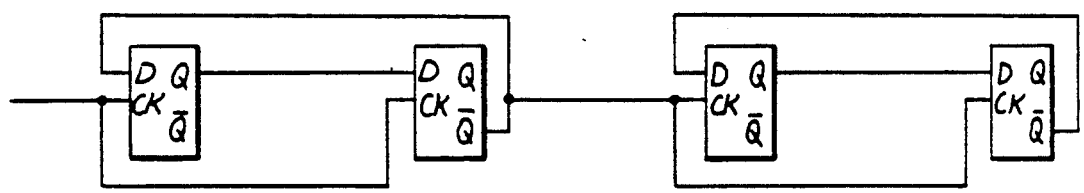
Figure 5C:
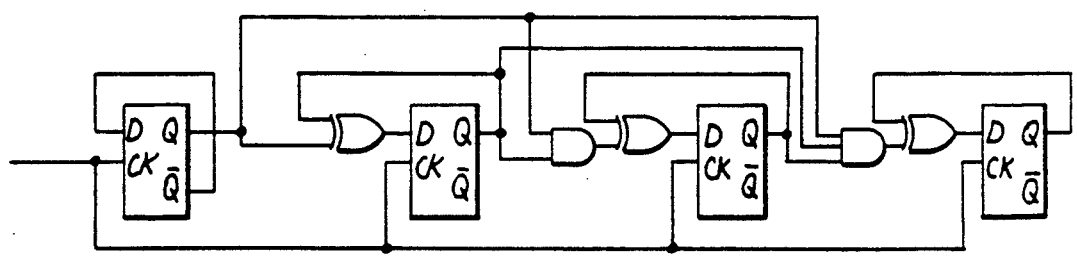
Figures 1, 7:
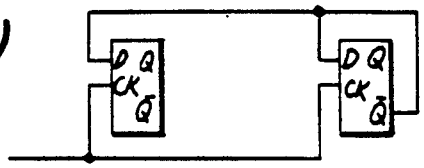
Figures 1, 7:
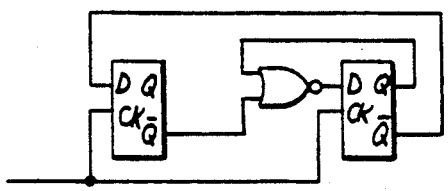
Figures 1, 7:
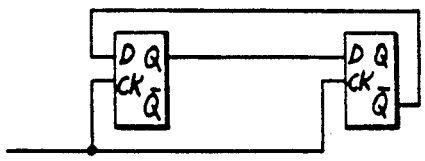
Figures 1, 7:
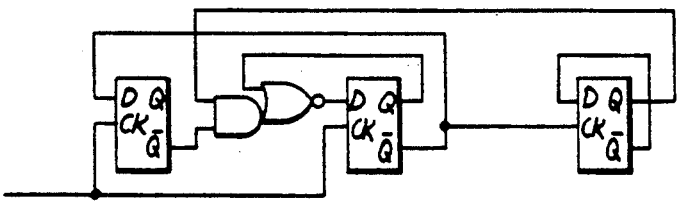
Figures 1, 7:
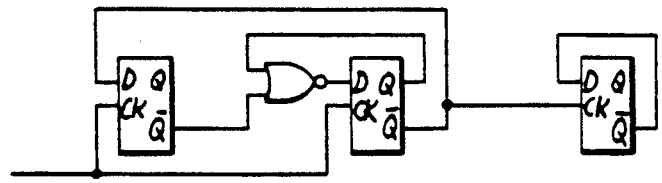
Figures 1, 7:
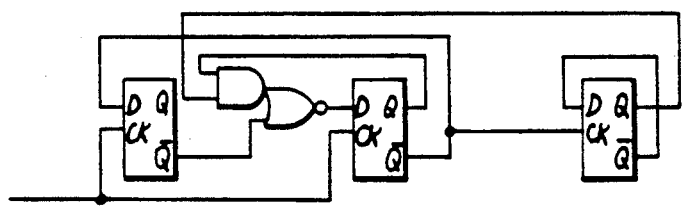
Figures 1, 7:
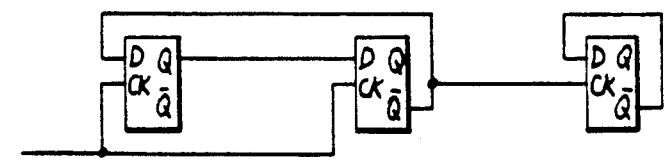
Figures 2, 7:
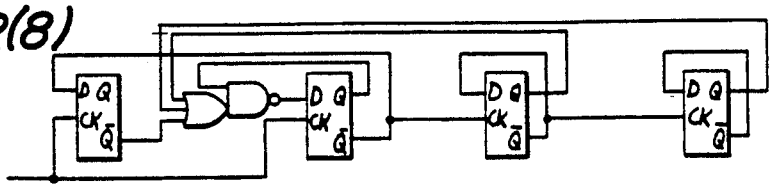
Figures 2, 7:
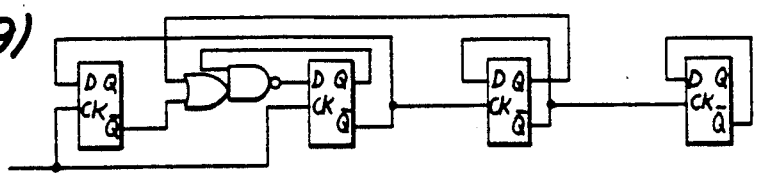
Figures 2, 7:
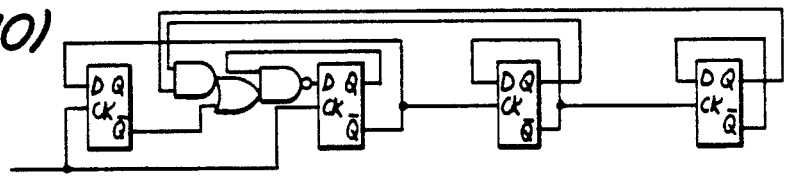
Figures 2, 7:
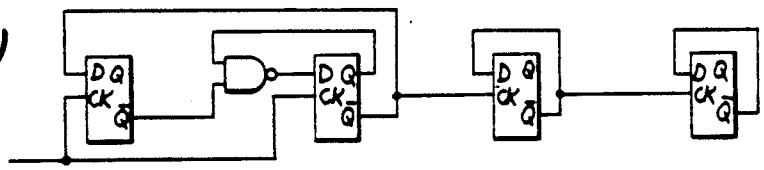
Figures 2, 7:
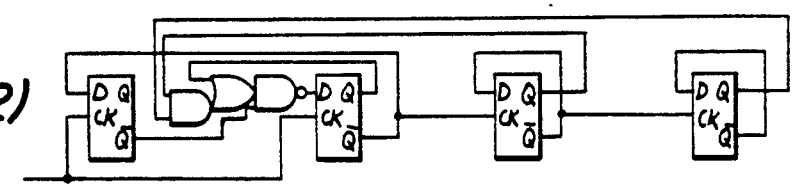
Figures 2, 7:
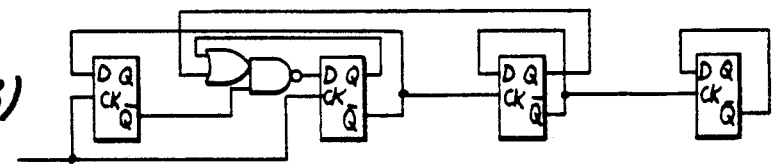
Figures 2, 7:
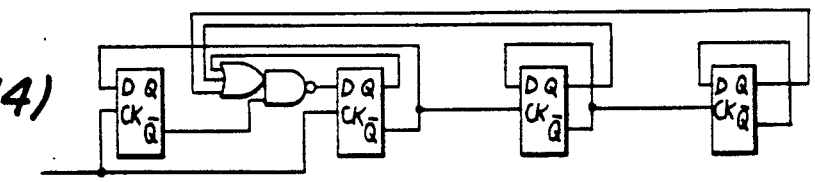
Figures 2, 7:
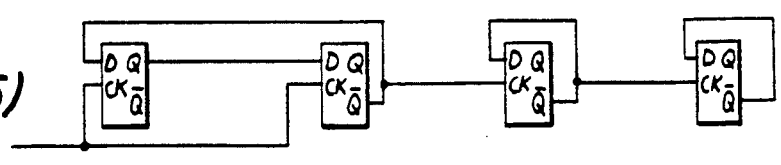
Figures 3, 7:
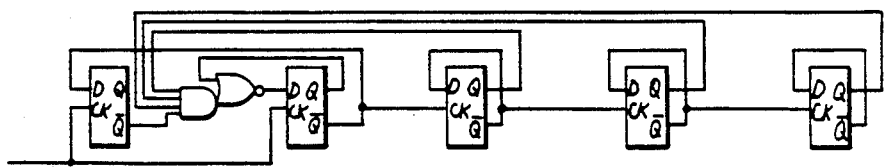
Figures 3, 7:
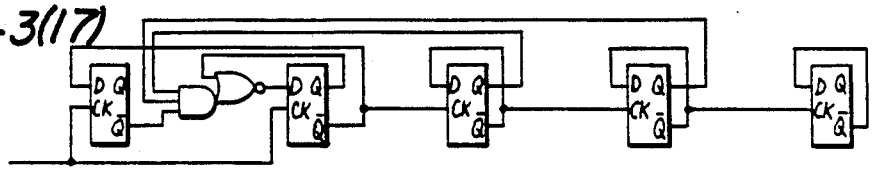
Figures 3, 7:
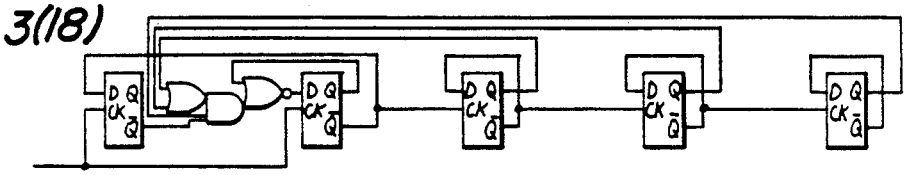
Figures 3, 7:
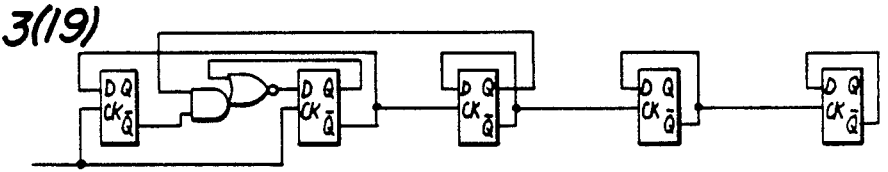
Figures 3, 7:
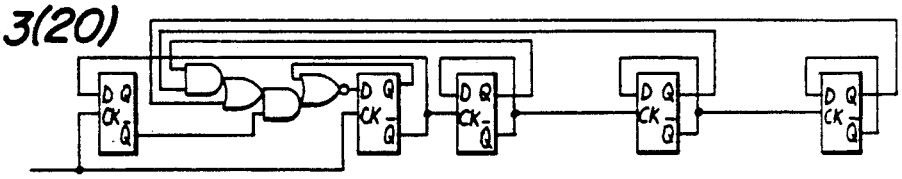
Figures 3, 7:
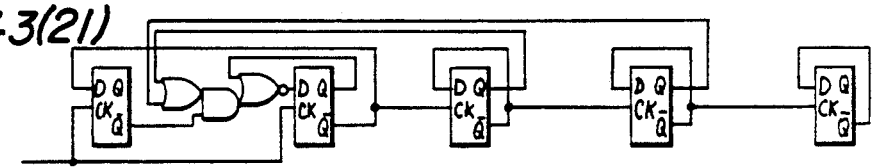
Figures 3, 7:
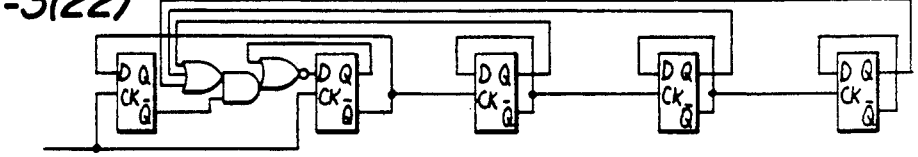
Figures 3, 7:
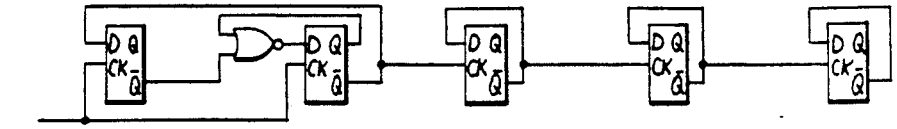
Figures 4, 7:
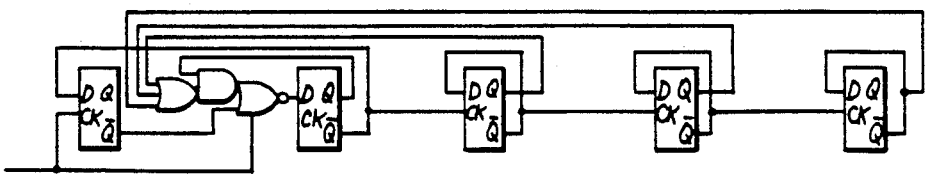
Figures 4, 7:
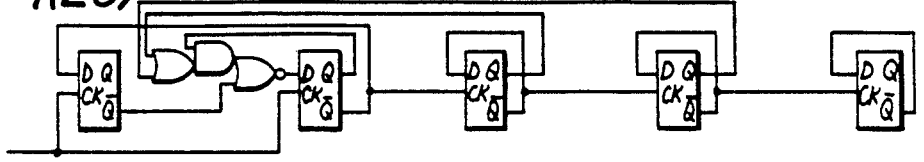
Figures 4, 7:
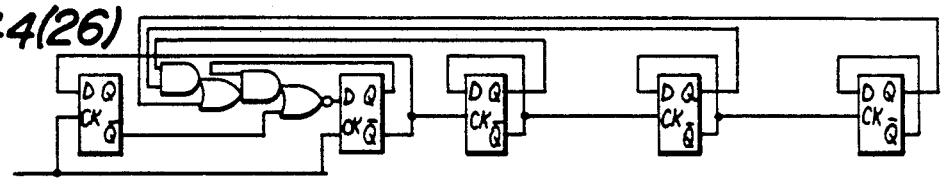
Figures 4, 7:
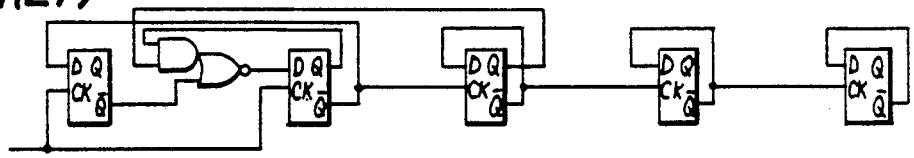
Figures 4, 7:
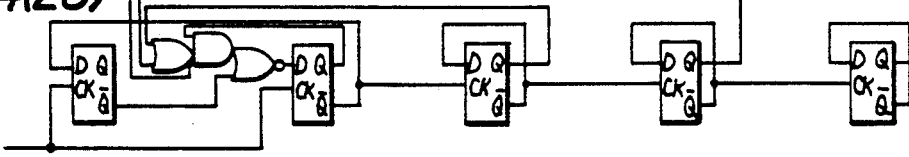
Figures 4, 7:
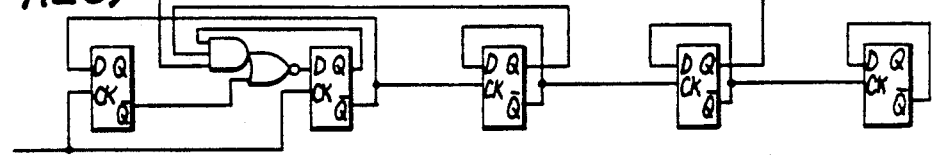
Figures 4, 7:
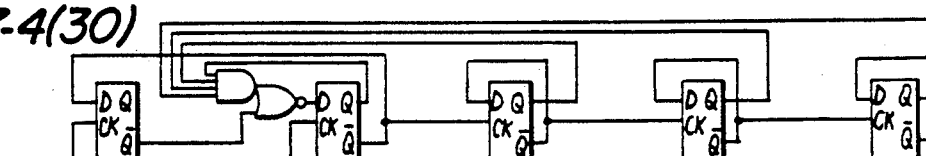
Figures 4, 7:
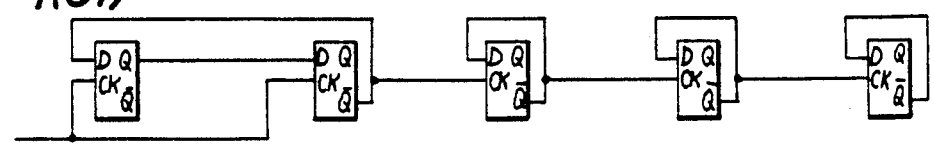
Figures 1, 8:
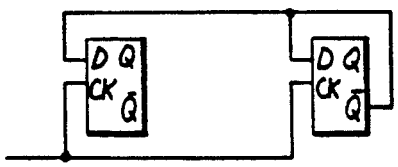
Figures 1, 8:
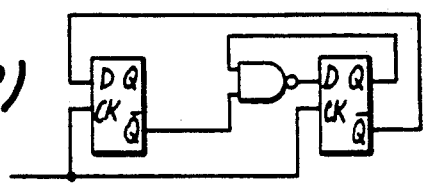
Figures 1, 8:
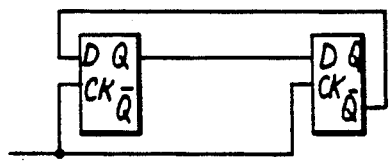
Figures 1, 8:
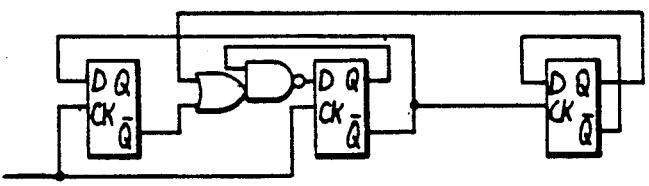
Figures 1, 8:
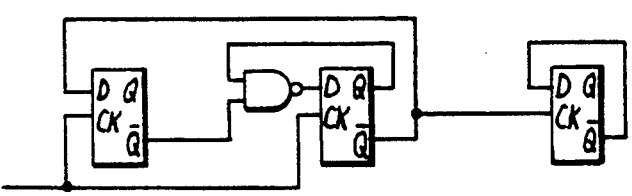
Figures 1, 8:
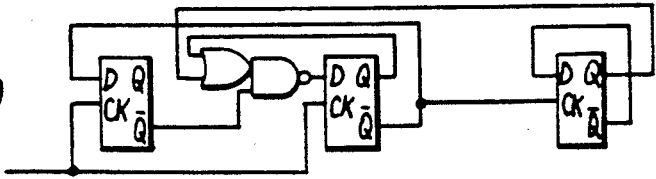
Figures 1, 8:
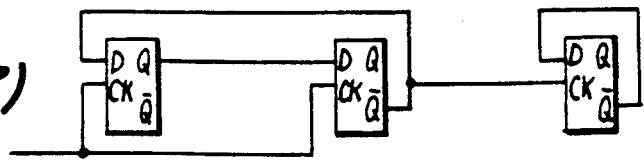
Figures 2, 8:
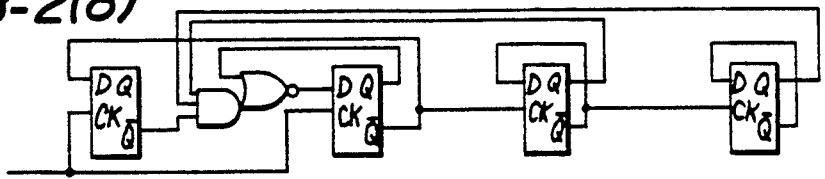
Figures 2, 8:
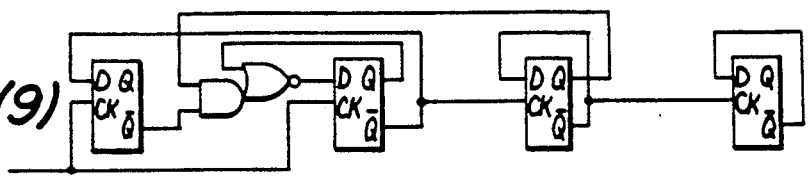
Figures 2, 8:
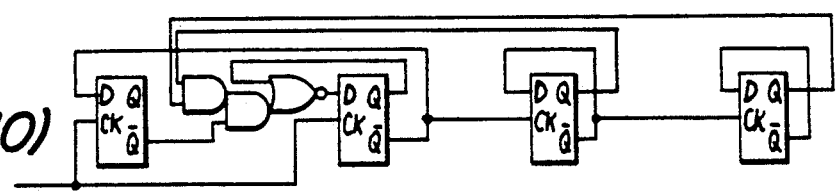
Figures 2, 8:
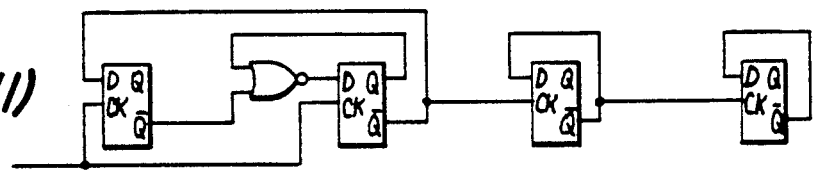
Figures 2, 8:
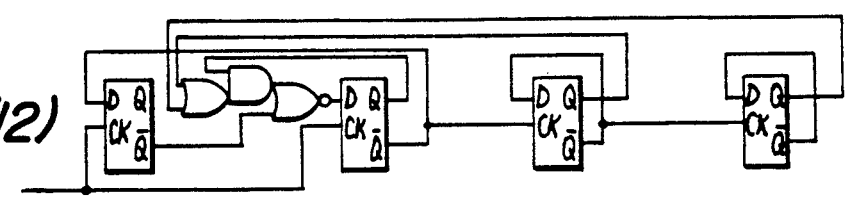
Figures 2, 8:
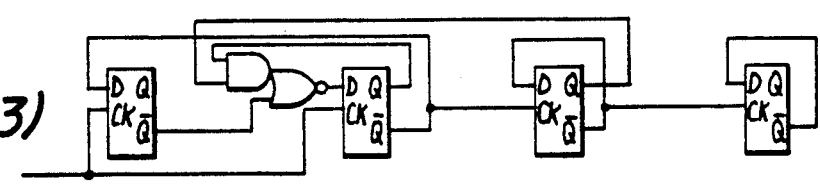
Figures 2, 8:
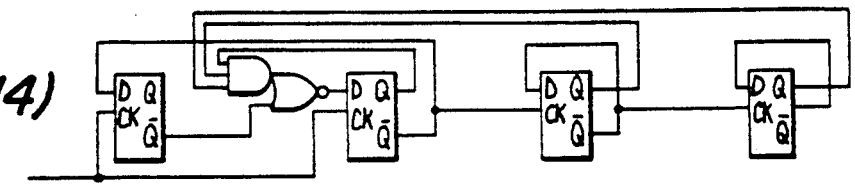
Figures 2, 8:
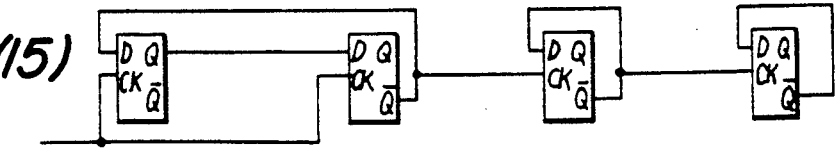
Figures 3, 8:
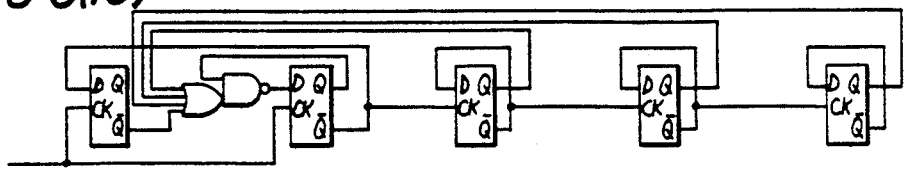
Figures 3, 8:
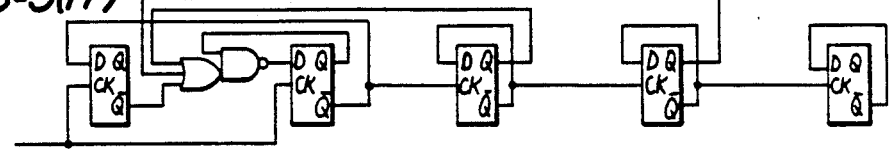
Figures 3, 8:
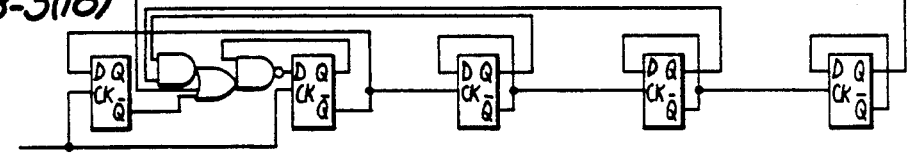
Figures 3, 8:
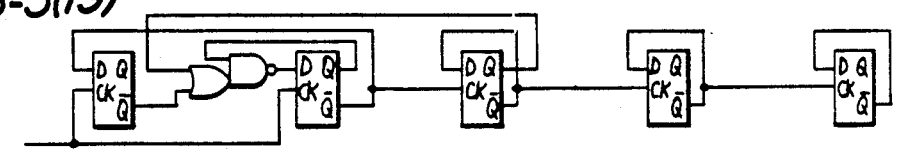
Figures 3, 8:
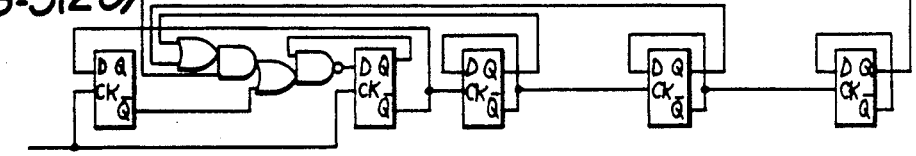
Figures 3, 8:
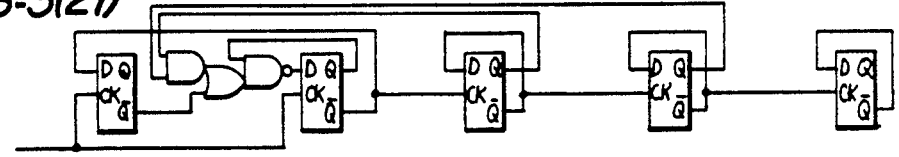
Figures 3, 8:
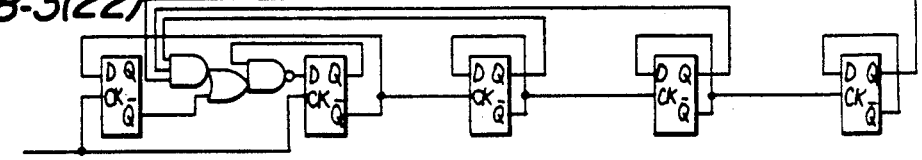
Figures 3, 8:
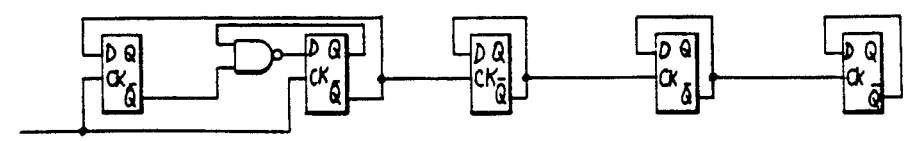
Figures 4, 8:
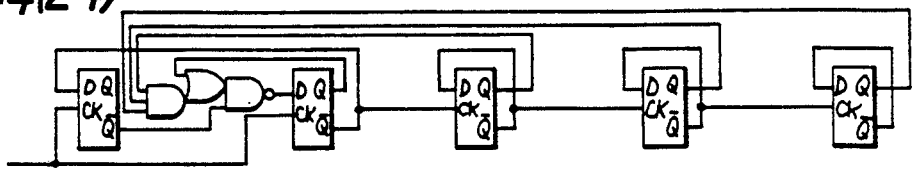
Figures 4, 8:
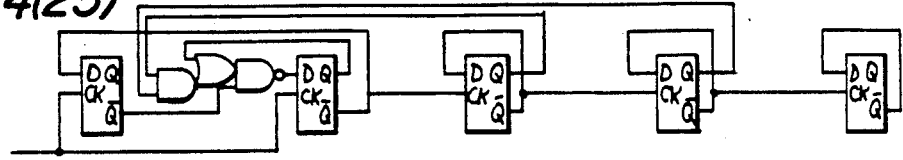
Figures 4, 8:
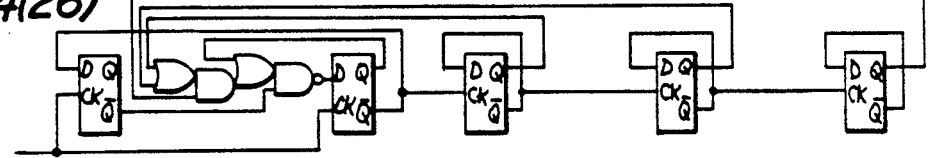
Figures 4, 8:
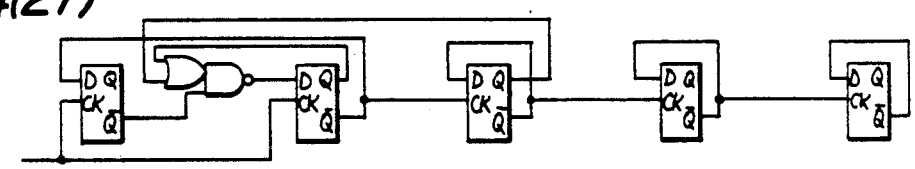
Figures 4, 8:
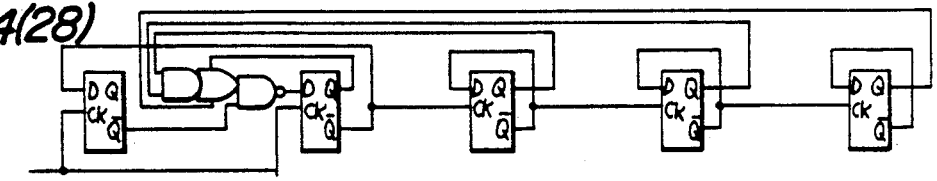
Figures 4, 8:
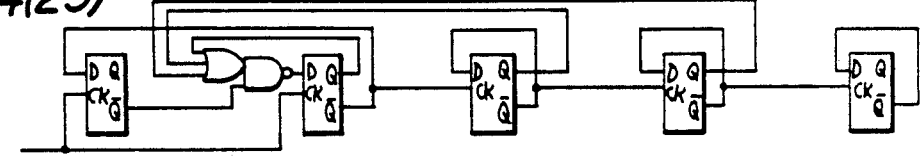
Figures 4, 8:
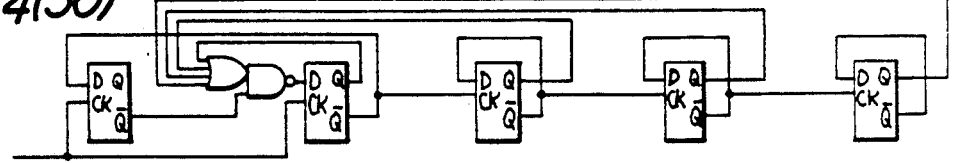
Figures 4, 8:
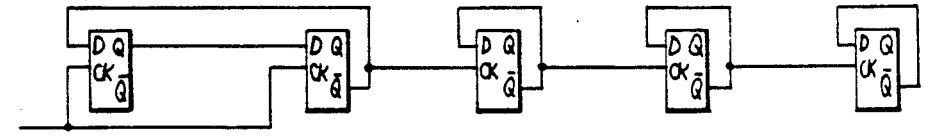

FIGS. 5(a), 5(b) and 5(c) illustrate alternative embodiments of succeeding counter section 12 having four flip-flops, (i.e., n=4). FIG. 5(a) illustrates a ripple counter and FIG. 5(c) illustrates a synchronous counter. FIG. 5(b) illustrates a combination between a ripple counter of FIG. 5(a) and a synchronous counter of FIG. 5(c).

FIGS. 6(a), 6(b) and 6(c) tabularly illustrate the operation of count control function section 3 when the number of flip-flops of succeeding counter section 2 is 1, 2 and 3 (i.e., n= 1, 2, 3) respectively. Referring to FIG. 6(a), the column entitled "times" represents the number of times that count control function section 3 assumes a high logic level relative to the number of values of output 7 which succeeding counter section 2 can assume. In FIG. 6(a), n=1, that is, there is only one flip-flop. Output 7 can assume only 2 values ($2^n$ combinations). The $\frac{1}{2}$ in the "times" column represents control signal 5 assuming a high logic level once for the two possible states of output 7. The 2/2 in the "times" column represents that control signal 5 assumes a high logic level for both states of output 7. The column entitled "circuit" illustrates the types of circuits of count control function section 3 which will produce control signal 5 corresponding to the associated "times" value. The columns entitled "4/3" and "3/2" represent that preceding counter section 1 can switch between a 4-ary and a 3-ary counter and between a 3-ary and a 2-ary counter, respectively. The values within the "4/3" and "3/2" columns indicate the number of different values which counter 100 can assume. For example, counter 100 functions as a 7-ary counter when control signal 5 assumes a high logic level for one of the two values of output 7.

Depending on the type of circuit used by count control function section 3, one or more outputs ($Q_0$, $Q_1$, $Q_2$) of output 7 produced by succeeding counter section 2 are supplied as inputs to count control section 3. Outputs $Q_0$, $Q_1$, $Q_2$ represent the individual outputs of a first, second and third flip-flop of succeeding counter section 2. Accordingly, when $n=1$ there is only one output $Q_0$ of succeeding counter section 2. The order of outputs $Q_0$, $Q_1$, $Q_2$ or use of their complements ($\overline{Q_0}$, $\overline{Q_1}$, $\overline{Q_2}$) as inputs to counter control function section 3 does not affect when control signal 5 assumes a high logic level. For example, control signal 5 will assume a high logic level three out of eight times whenever the logic circuit is as illustrated in the third case of FIG. 6(c). This is true if the outputs of the succeeding counter section 2 are as shown (i.e. $\overline{Q_0} \cdot (\overline{Q_1} + \overline{Q_2})$) or the outputs of succeeding counter section 2 are rearranged or their compliments are used. Therefore, outputs of succeeding counter section 2 such that $\overline{Q_2} \cdot (\overline{Q_1} + \overline{Q_0})$, $Q_0 \cdot (Q_1 + Q_2)$, $Q_0 \cdot (\overline{Q_1} + \overline{Q_2})$ or the like, will nevertheless result in control signal 5 assuming a high logic level three out of eight times, if the logic circuit remains unchanged.

Each of the components of counter 100, that is, preceding counter section 1, succeeding section 2, and count control function section 3 have been described in accordance with alternative embodiments of the invention, and, in particular, with reference to FIGS. 4-1(a)-4-1(f), 4-2(a)-4-2(f), 5(a)-5(c) and 6(a)-6(c). Any desired asynchronous, nonlogical counter in accordance with the invention can be provided by combining any one of the embodiments of each of these components with any one of the embodiments of each of the other components. FIGS. 7-1, 7-2, 7-3 and 7-4 illustrate 31 of these combinations as additional alternative embodiments of counter 100 ranging from a 2-ary counter through a 32-ary counter. FIGS. 8-1, 8-2, 8-3 and 8-4 illustrate an additional 31 combinations as further additional alternative embodiments of counter 100 ranging from a 2-ary counter through a 32-ary counter. Embodiments (1)-(31) of FIGS. 7-1 through 7-4 and embodiments (1)-(31) of FIGS. 8-1 through 8-4 correspond to a 2-ary counter–a 32-ary counter, respectively. The same numbered embodiment shown in parentheses in FIGS. 7-1 through 7-4 and FIGS. 8-1 through 8-4 have the same logic circuit for the succeeding counter section but differ in the logic circuit of the preceding counter section. The method for constructing counter 100 assuming that an M-ary counter is desired is as follows:

Step One

Express M-1 in binary notation such that:

$$M - 1 = a_0 \times 2^0 + a_1 \times 2^1 + \ldots + a_{n-1} \times 2^{n-1} + a_n \times 2^n + a_{n+1} \times 2^{n+1}$$

where $a_{n+1} = 0$ and determine the value of $a_0, a_1 \ldots a_n$ (i.e. either 0 or 1).

Step Two

When $a_n = 1$, the preceding counter section should be constructed so as to vary between functioning as a 4-ary counter and a 3-ary counter using, for example, one of the logic circuits of FIGS. 4-1(a)-4-1(f). When $a_n = 0$, the preceding counter section should be constructed so as to vary between functioning as a 3-ary counter and a 2-ary counter using, for example, one of the logic circuits of FIGS. 4-2(a)-4-2(f).

Step Three

The succeeding counter section includes n flip-flops. Construct a $2_n$-ary counter using, for example, one of the logic circuits of FIGS. 5(a), 5(b) or 5(c) to form a succeeding counter section having n flip-flops.

Step Four

Construct the count control function section. When $n = 1, 2$ or 3, the logic circuits of FIGS. 6(a), 6(b) or 6(c) can be used. The count control function circuit should embody a $(K+1)/2^n$ mode wherein:

$$K = a_0 \times 2^0 + a_1 \times 2^1 + \ldots + a_{n-1} \times 2^{n-1}$$

that is, K is the binary expression for M-1 excluding the two high order bits. $2^n$ shows the number of frequency dividing ratio of the succeeding counter section, and $k+1$ shows the number of operation of the preceding counter as the one-fourth frequency dividing counter (when the preceding counter is controlled to one-fourth or one-third frequency dividing mode).

Step Five

Combine the preceding counter section, succeeding counter section and count control function section of Steps Two, Three and Four, respectively, to form the M-ary counter.

Figure 9:
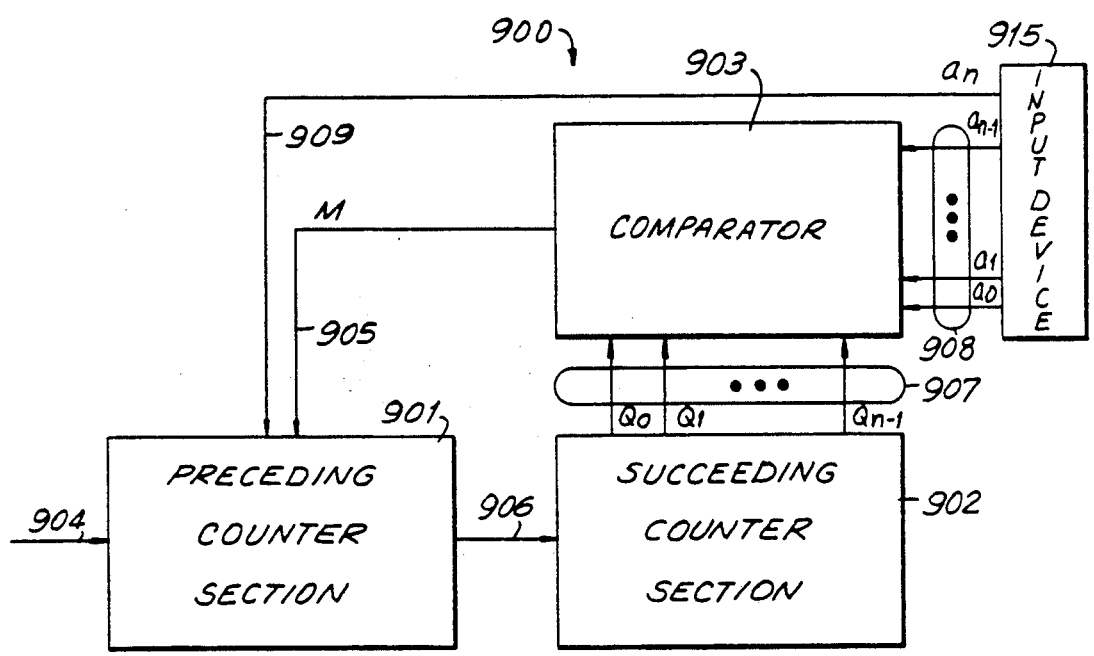
FIG. 9 is a block diagram of an asynchronous counter in accordance with an alternative embodiment of the invention.

As shown in FIG. 9 a programmable asynchronous counter 900 in accordance with a second embodiment of the invention includes a preceding counter section 901, a succeeding counter section 902, a comparator 903 and an instruction input delivery device 915. Preceding counter section 901 includes a clock input 904 and an output 906 which is provided to a clock input of succeeding counter section 902. Outputs 907 (i.e. $Q_0$, $Q_1$, . . . $Q_{n-1}$) are supplied to the input of comparator 903. A frequency dividing ratio instruction input of $n+1$ bits includes n low order bits 908 (i.e. $a_{n-1}$, . . . $a_1$, $a_0$) and a highest order bit 909 ($a_n$) supplied by device 915. Preceding counter section 901 receives a clock signal supplied to clock input 904, a control signal 905(M) produced by comparator 903 and highest order bit 909. Control signal 905 and highest order bit 909 control the frequency dividing ratio of preceding counter section 901.

The relationship between $a_n/M$ and the frequency dividing ratio of preceding counter section 901 is as follows: When $a_n = M = 1$, preceding counter section 901 functions as a 4-ary counter. When $a_n = 1$ and $M = 0$, preceding counter section 901 functions as a 3-ary counter. When $a_n = 0$ and $M = 1$, preceding counter section 901 functions as a 3-ary counter. When $a_n = M = 0$, preceding counter section 901 functions as a 2-ary counter.

Succeeding counter section 902 includes n flip-flops functioning as a $2^n$-ary counter. None of the flip-flops of preceding counter section 901 and succeeding counter section 902 use a reset signal for controlling the count value of either section; a significant feature in the operation and construction of the invention.

Comparator circuit 903 compares outputs 907 ($Q_0-Q_{n-1}$) of succeeding counter section 902 with n low-order bits 908 ($a_0-a_{n-1}$). When outputs 907 are equal to or less than n low-order bits 908, control signal 905 (M) assumes a high logic level. In other words, when $a_{n-1} \; x_2^{n-1} + \ldots + a_1 \; x_2^1 + a_0 x_2^0 \geq Q_{n-1}X_2^{n-1} + \ldots + Q_1X_2^1 + Q_0X_2^0$, control signal 905 assumes a high logic level and otherwise, control signal 905(M) assumes a low logic level. Operation of counter 900 based on the frequency dividing (demultiplication) ratio instruction input $a_n, a_{n-1}, \ldots a_1, a_0$ is as follows:

When $a_n=1$, preceding counter section 901 functions as either a 4-ary counter or a 3-ary counter depending on the logic level of M. The n low-order bits ($a_0-a_{n-1}$) of the frequency dividing (demultiplication) instruction input can be represented in binary notation by A as follows:

$$A = a_{n-1} \times 2^{n-1} + \ldots + a_1 \times 2^1 + a_0 \times 2^0$$

Control signal 905 (M) assumes a high logic level (A+1) times when output 907 of succeeding counter section 902 is varying from 0 to A. Accordingly, for (A+1) times, preceding counter section 901 functions a 4-ary counter. Control signal 905 (M) assumes a low logic level for ($2^n-A-1$) times when output 907 of succeeding counter section 902 is varying from (A+1) to $2^n-1$, that is for ($2^n-A-1$) times, preceding counter section 901 functions as a 3-ary counter. In other words, counter 900 functions as a $\{4\times(A+1)+3\times(2^n-A-1)\}$-ary counter which can be rewritten as a ($2^{n+1}+2^n+A+1$)-ary counter.

When $a_n=0$, preceding counter section 901 functions as a 3-ary counter (A+1) times and as a 2-ary counter ($2^n-A-1$) times. In other words, counter 900 functions as a $\{3\times(A+1)+2\times(2^n-A-1)\}$-ary counter which can be rewritten as a ($2^{n-1}+A+1$)-ary counter. Since counter 900 functions as a ($2^{n+1}+A+1$)-ary counter when $a_n=1$ and as a ($2^{n+1}+A+1$)-ary counter when $a_n=0$, counter 900 can be considered as a ($2^{n+1}+a_n\times2^n+A+1$) = ($2^{n+1}+a_n\times2^n+a_{n-1}\times2^{n-1}+\ldots+a_1\times2^1+a_0\times2^0+1$)-ary counter regardless of the value of $a_n$. Therefore, counter 900 is a programmable counter having a frequency dividing (demultiplication) ratio of ($2^{n+1}+a_n\times2^n+a_{n-1}\times2^{n-1}+\ldots a_1\times2^1+a_0\times2^0+1$) based on the frequency dividing (demultipliation) ratio instruction input ($a_n, a_{n-1}, \ldots a_1, a_0$).

Figure 10:
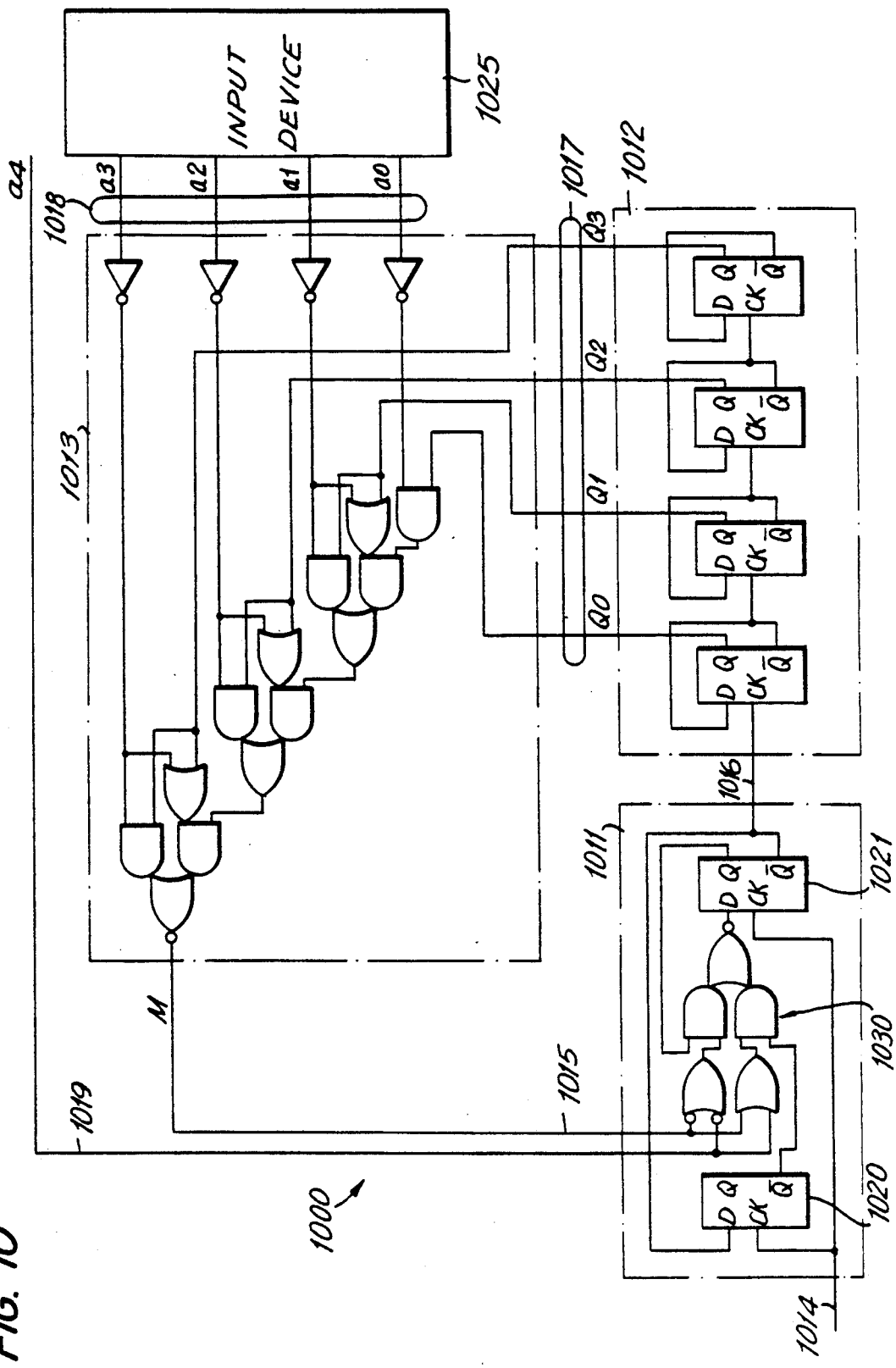
FIG. 10 is a logic circuit of the counter of FIG. 9.

In accordance with one embodiment of counter 900, FIG. 10 illustrates a counter 1000 in which n=4. Counter 1000 includes a preceding counter section 1011, a succeeding counter section 1012 having an output 1017 and a comparator 1013. Preceding counter section 1011 includes a clock input 1014, a pair of flip-flops 1020 and 1021 and an output 1016 which is supplied to the clock input of succeeding counter section 1012. Outputs 1017 of succeeding counter section 1012 serve as the inputs to comparator 1013. A frequency dividing (demultiplication) ratio instruction input $a_4, a_3, a_2, a_1, a_0$ is provided by an instruction input device 1025. Low order bits $a_0-a_3$ form a low order bit input 1018 supplied to comparator 1013. Bit $a_4$ serves as highest order bit 1019 which together with control signal 1015 (M) is supplied to a gate circuit 1030 and controls the frequency dividing (demultipliation) ratio of preceding counter section 1011. Operation of counter 1000 is substantially similar to the operation of counter 900.

Figure 11A:
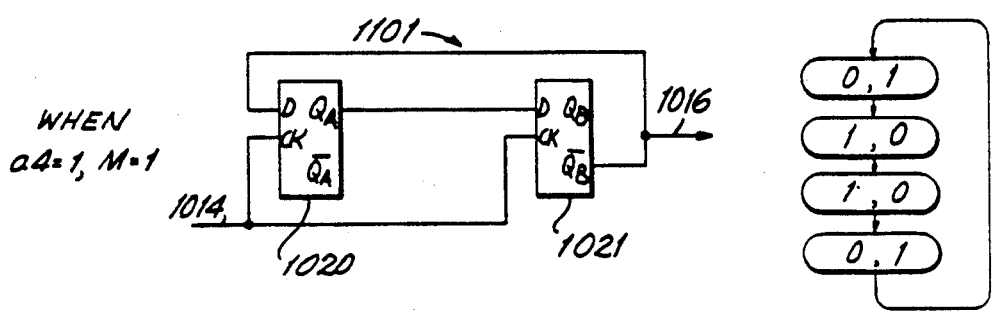
FIGS. 11(a), 11(b) and 11(c) are equivalent logic circuits of the preceding counter section of FIG. 9.
Figure 11B:
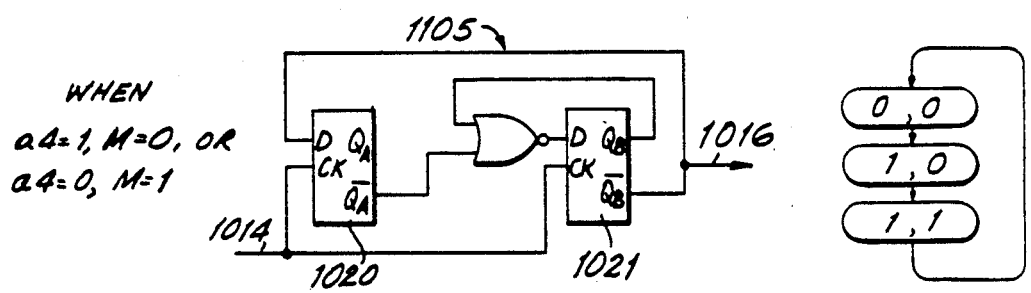
Figure 11C:
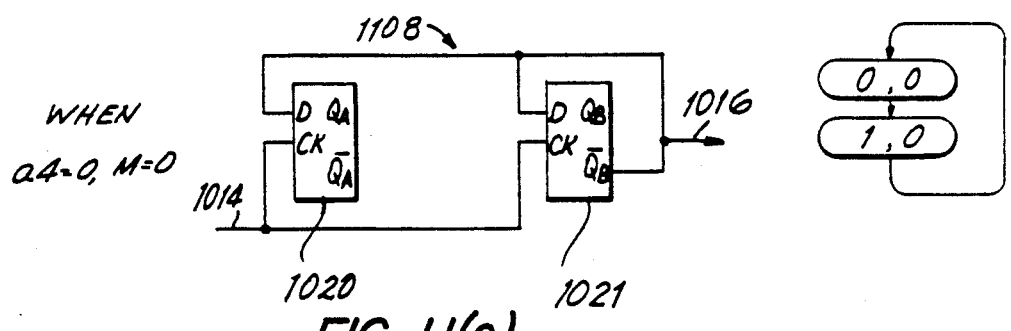
Figure 12A:
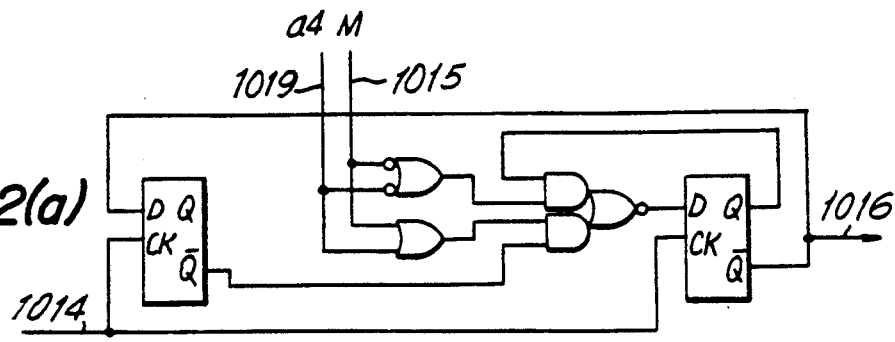
FIGS. 12(a), 12(b), 12(c) and 12(d) are alternative logic circuits of the preceding counter section of FIG. 9.
Figure 12B:
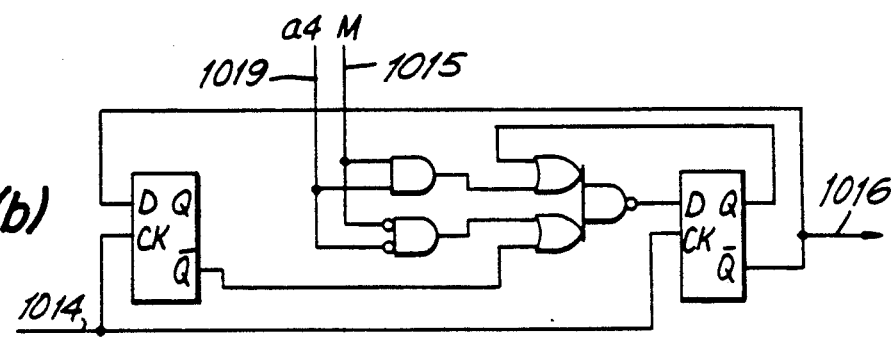
Figure 12C:
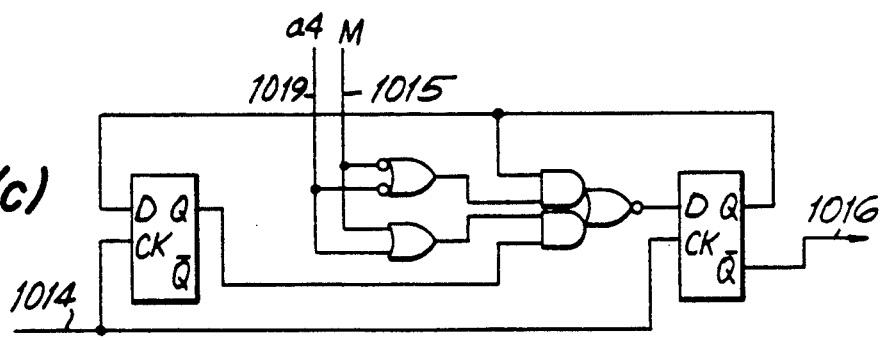
Figure 12D:
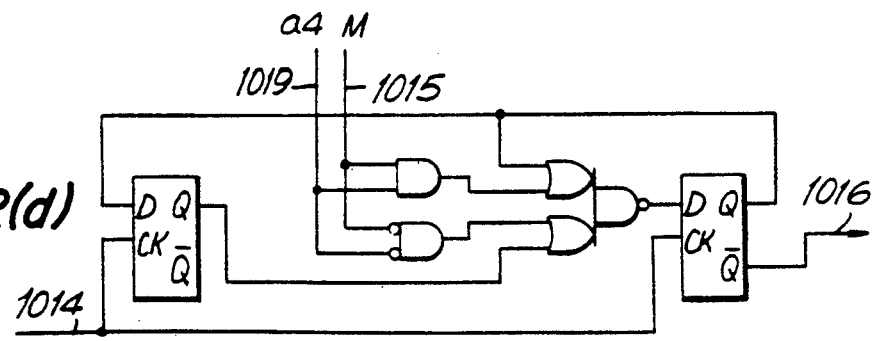

Preceding counter section 1011 changes from a frequency dividing (demultiplication) ratio of 4, 3 or 2 depending on the values of $a_4$ and M. As shown in FIGS. 11(a), 11(b) and 11(c), equivalent preceding counter sections 1011 also include flip-flops 1020 and 1021 having a pair of outputs $Q_A$ and $Q_B$, respectively. As shown in FIG. 11(a), when $a_4=M=1$, preceding counter section 1011 functions as a 4-ary counter having the equivalent logic configuration 1101. As clock pulses are provided to clock input 1014 ($Q_A$, $Q_B$) sequentially assume the values of $(0,0)\rightarrow(1,0)\rightarrow(1,1)\rightarrow(0,1)$. When $a_4=1$ and M=0 or $a_4=0$ and M=1, preceding counter section 1011 functions as a 3-ary counter 1105 as shown in FIG. 11(b). As clock pulses are received at clock input 1014, ($Q_A$, $Q_B$) assume the values of $(0,0)\rightarrow(1,0)\rightarrow(1,1)$. When $a_4=M=0$, preceding counter section 1011 functions as a 2-ary counter 1108 as shown in FIG. 11(c). As clock pulses are received at clock input 1014, ($Q_A$, $Q_B$) assume the values of $(0,0)\rightarrow(1,1)$.

FIGS. 12(a)-12(d) illustrate alternative embodiments of preceding counter section 1011 in accordance with the invention. Each of these embodiments maintains the same relationship as exhibited by preceding counter section 1011 with respect to $a_4$/M and the frequency dividing (demultiplication) ratio.

Referring once again to FIG. 10, succeeding counter section 1012 is a ripple counter, that is, the clock is derived from a previous stage output. Succeeding counter section 1012, however, is not limited to ripple counters and also can include any $2^4$-ary counter of the synchronous type. Comparator circuit 1013 compares the values of $a_0$ to $Q_0$, $a_1$ to $Q_1$, $a_3$ to $Q_3$ and $a_4$ to $Q_4$. Alternatively, the output complements ($\overline{Q}$) of succeeding counter section 1012 can be compared to lower-order bits 1018. Still further, the order in which $Q_0-Q_3$ is compared to lower-order bits 1018 can be changed. For example, ($a_0$, $a_1$, $a_2$, $a_3$) can be compared with ($Q_3$, $Q_2$, $Q_1$, $Q_0$), ($Q_2$, $\overline{Q_0}$, $\overline{Q_3}$, $Q_1$), or the like, respectively. The order of output 1017 and whether one or more complements of output 1017 are used in comparing to lower-order bits 1018 is not essential to the successful operation of comparator 1000. More particularly, comparison of the outputs of succeeding counter section 1012 and lower-order bits 1018 is not based in terms of the magnitude of any particular bit. It is only essential that the comparison result in control signal 1015 (M) assuming a high logic level (A+1) times in response to the sixteen combinations of output values that succeeding counter section 1017 can assume.

It is also to be understood that although preceding counter section 1011, succeeding counter section 1012 and comparator circuit 1013 can be constructed in several alternative embodiments (e.g. FIGS. 12(a)-12(d)), counter 1000 or an alternative embodiment thereof functions as a ($2^5+a_4\times2^4+a_3\times2^3+a_2\times2^2+a_1\times2^1+a_0\times2^0$)-ary programmable counter based on the frequency dividing (demultiplication) ratio instruction input ($a_4$, $a_3$, $a_2$, $a_1$, $a_0$). Therefore, any one of 33-ary through 64-ary modes can be established by changing $a_4$ through $a_0$.

Figure 13A:
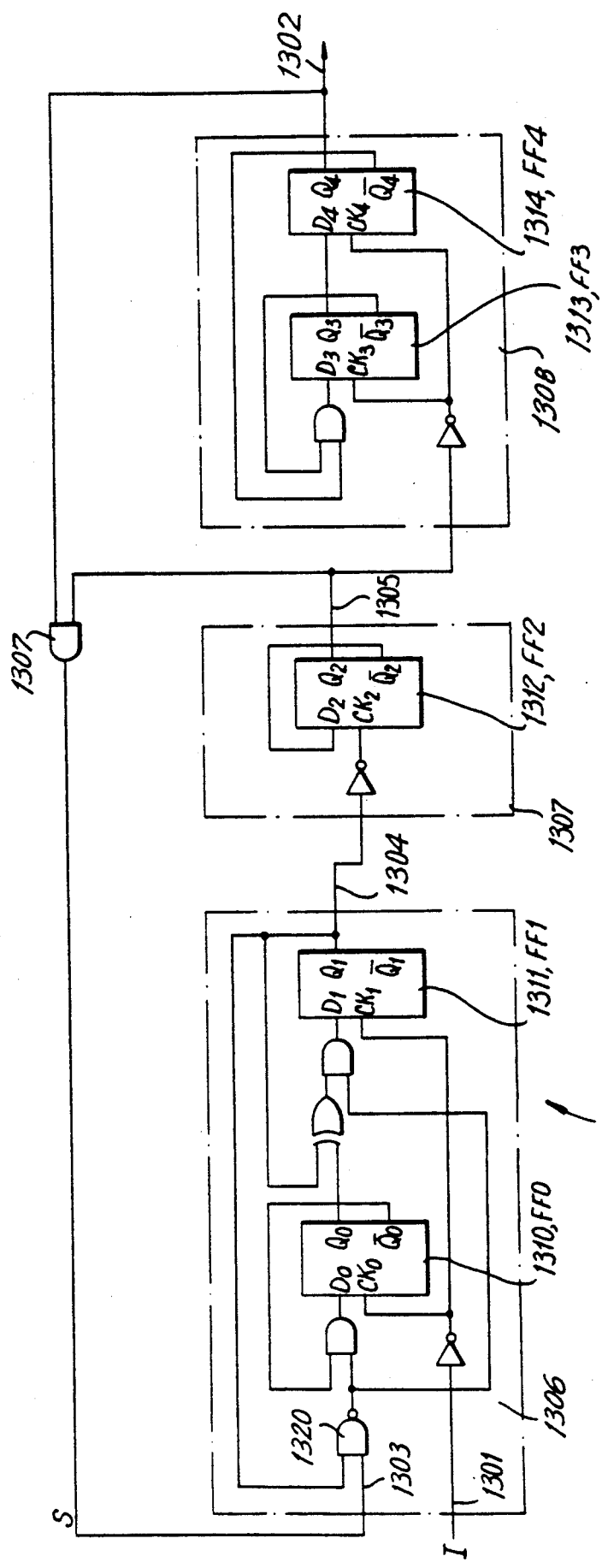
FIG. 13(a) is a logic circuit of an asynchronous counter in accordance with another alternative embodiment of the invention.
Figure 15A:
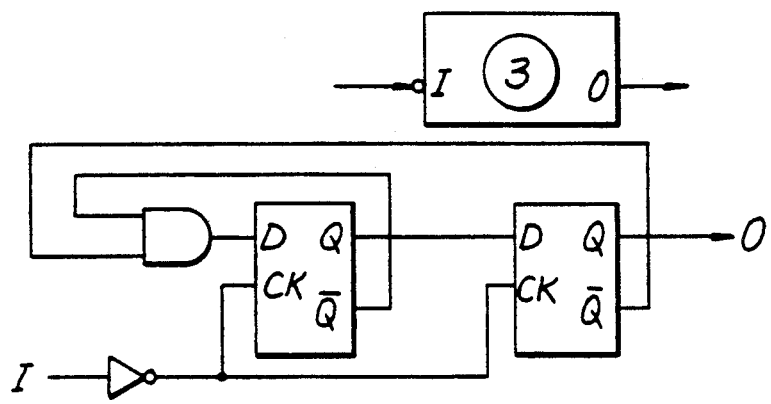
FIGS. 15(a), 15(b), 15(c) and 15(d) are equivalent logic circuits and corresponding symbolic block diagrams of the B-type counter of FIG. 13(a)
Figure 15B:
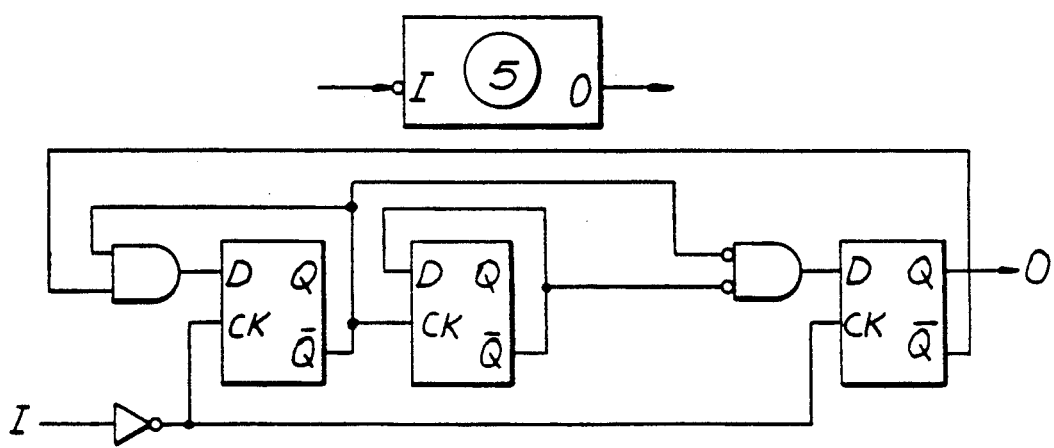
Figure 15C:
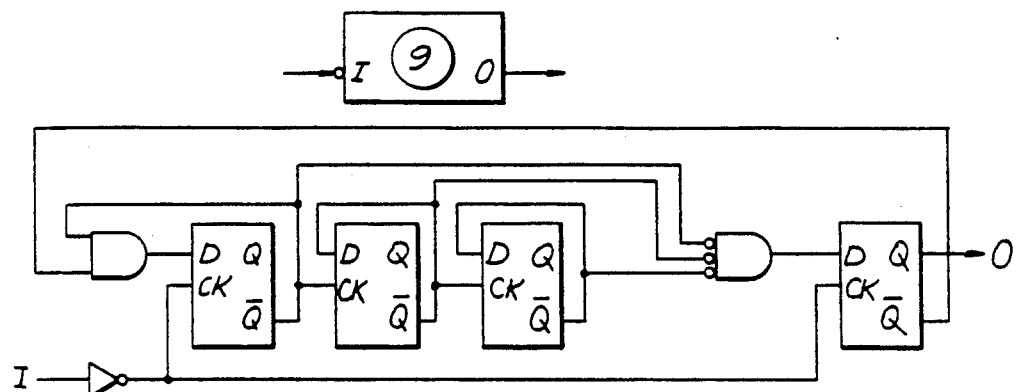
Figure 15D:
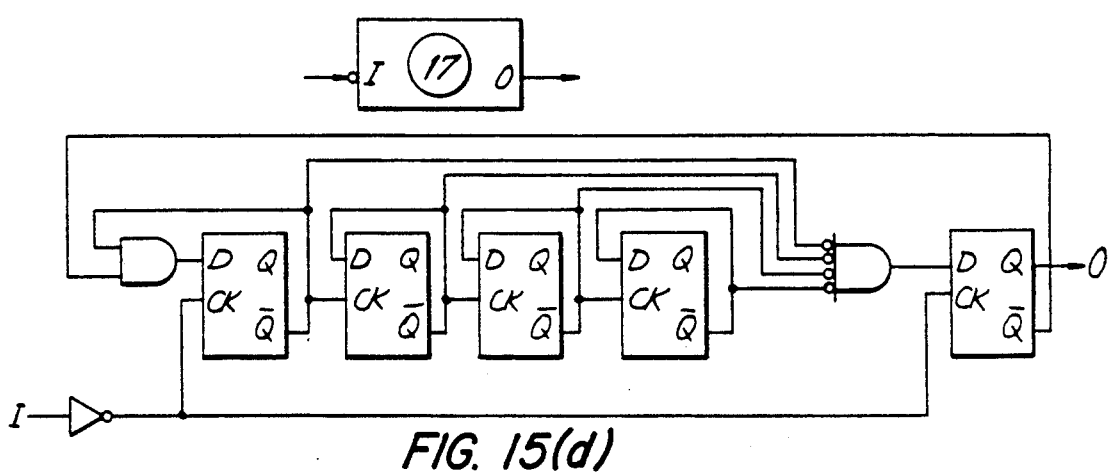
Figure 16A:
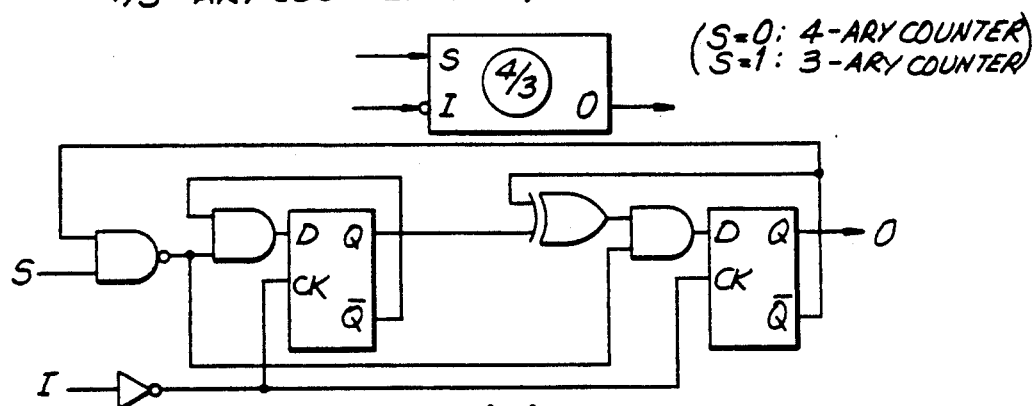
FIGS. 16(a), 16(b), 16(c) and 16(d) are equivalent logic circuits and corresponding symbolic block diagrams of the C-type counter of FIG. 13(a)
Figure 16B:
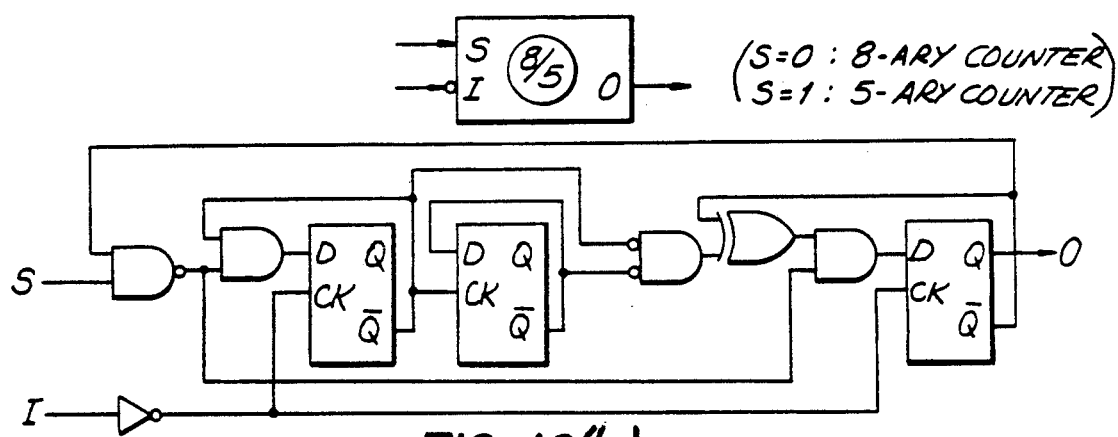
Figure 16C:
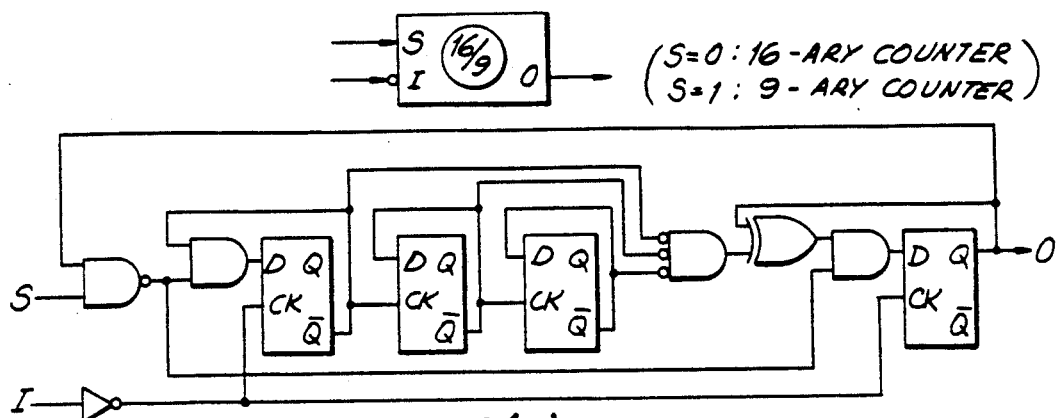
Figure 16D:
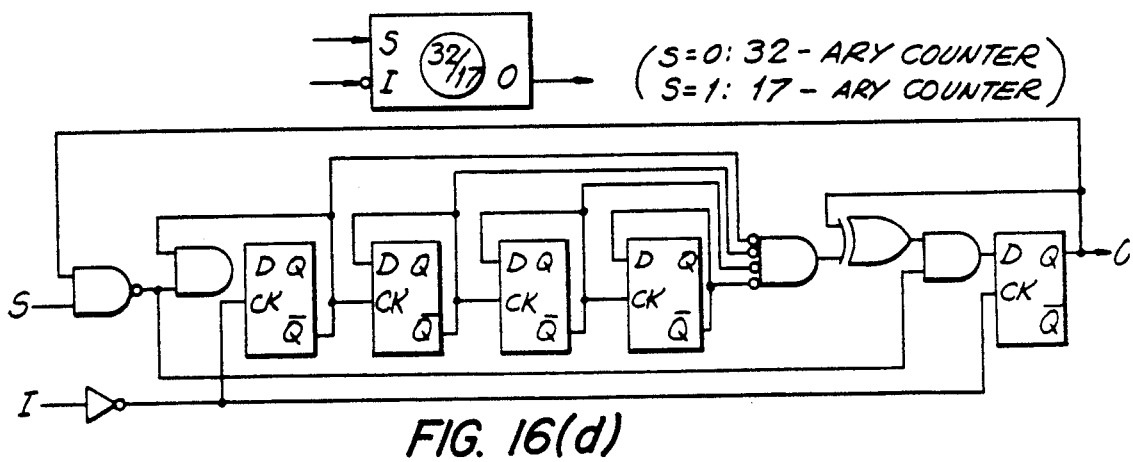
Figure 17A:
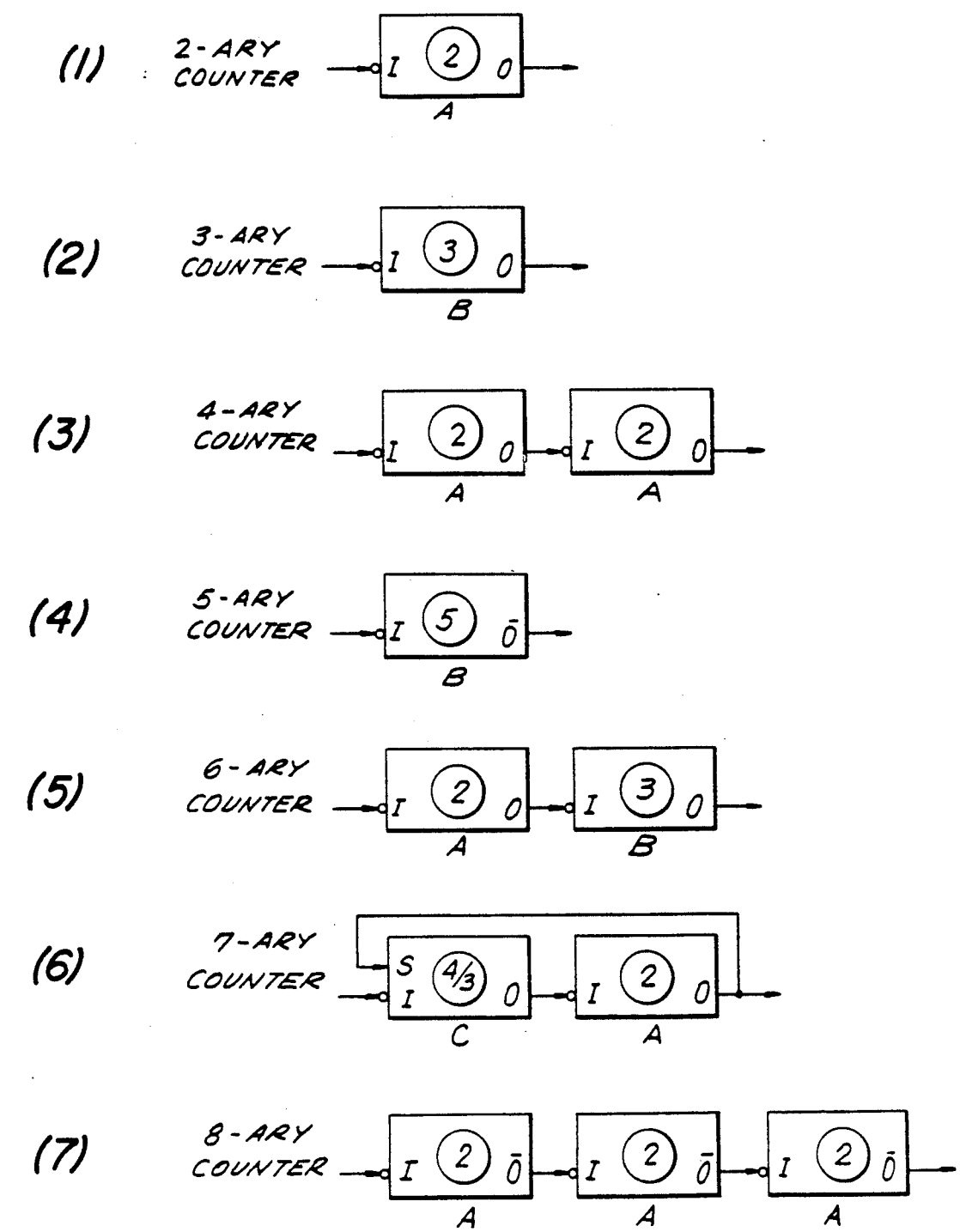
Figure 17D:
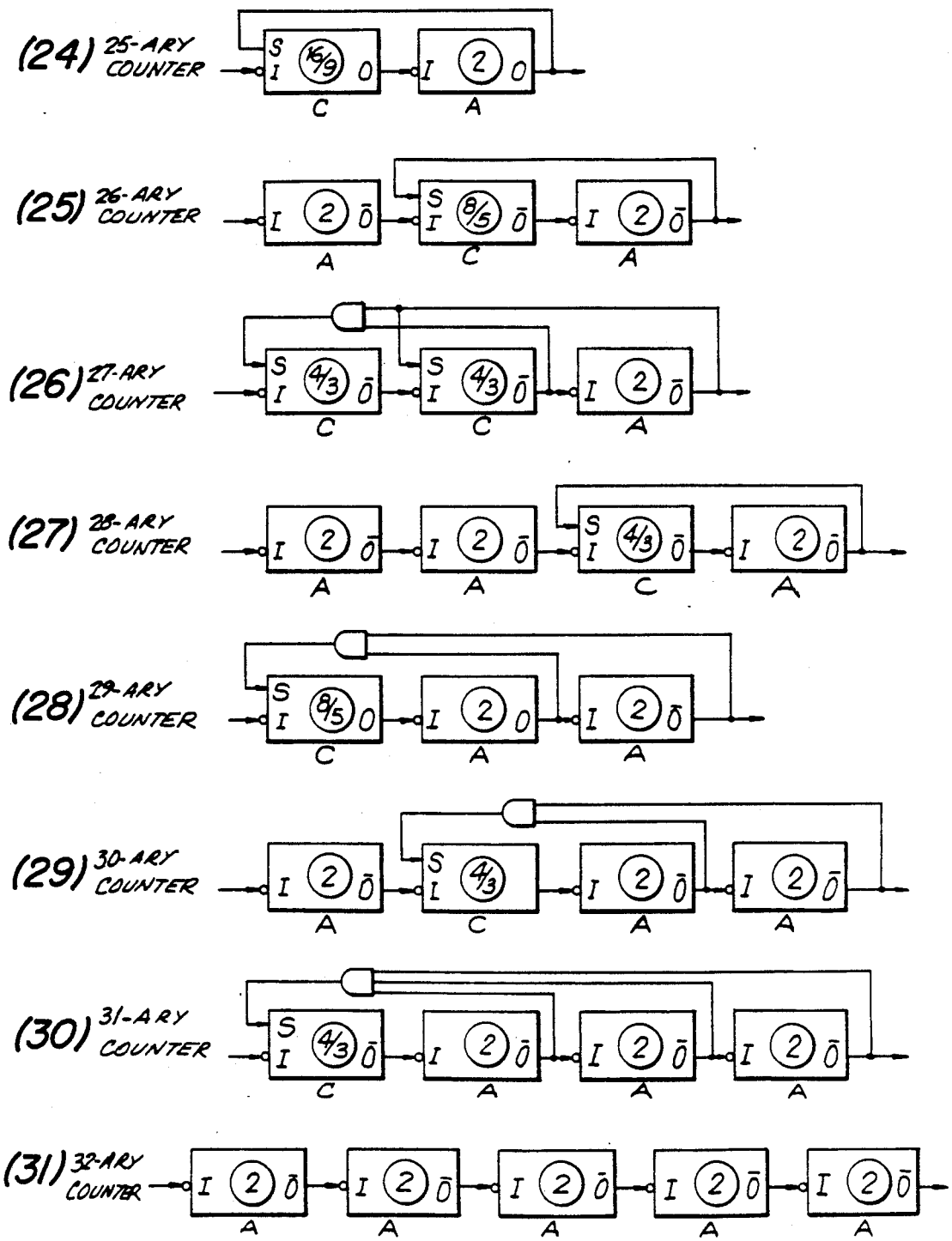

As shown in FIG. 13(a) a counter 1300 in accordance with a third embodiment of the invention functions as a 23-ary counter of the asynchronous type. The method for constructing counter 1300 is as follows:

Step One

When an N-ary counter is to be constructed, express N−1 in binary form. Therefore, for a 23-ary counter, N−1=22 such that $(Q_4, Q_3, Q_2, Q_1, Q_0)=(10110)$.

Step Two

Examine the binary expression of N−1 from the low order side and when a "1" is found, group all bits up to including the "1" as one block. Accordingly, each block includes only one "1" bit by itself or combined with one or more "0" bits (i.e. 10 ... 0). These blocks are indexed as a first block, a second block, and so on. In the case of a 23-ary counter, the bits are grouped into three blocks. The first block includes $Q_4$, $Q_3$, that is, $(Q_4, Q_3)=(10)$. The second block includes $Q_2$, that is, $(Q_2)=(1)$. The third block includes $Q_1$, $Q_0$, that is $(Q_1, Q_0)=(10)$.

Step Three

Replace the first block with an A-type counter unit or a B-type counter unit. When the first block includes one bit, that is, the block expression is (1), replace with a 2-ary counter. As used herein, the 2-ary counter is referred to as a A-type counter unit. When the first block includes at least two bits, that is, the block expression is (10 ... 0), replace with a $(2^{n-1}+1)$-ary counter where n is the number of bits in the block. As used herein, the $(2^{n-1}+1)$-ary counter is referred to as the B-type counter. Since the first block for the 23-ary counter has a block expression (10), the first block is replaced with a B-type counter unit which functions as a 3-ary counter.

Step Four

Replace the second block and each block thereafter with either an A-type counter unit or a C-type counter unit. When the second block and each block thereafter includes one bit such that the block expression is (1), replace with a 2-ary counter (i.e. A-type counter unit). When the second block or each succeeding block to be considered includes at least two bits such that the block expression is (10 ... 0), replace with the C-type counter unit. The C-type counter unit has two frequency dividing (demultiplication) ratios of $2^n$ and $(2^{n-1}+1)$ where n is the number of bits in the block. Accordingly, the C-type counter unit functions as either a $2^n$-ary counter when the control input is at a low logic level and as a $(2^{n-1}+1)$-ary counter when the control input is at a high logic level. The C-type counter unit functions as a $\{2^n/(2^{n-1}+1)\}$-ary counter.

For a 23-ary counter, the second block has a block expression of (1). Therefore, replace with the A-type counter unit (a 2-ary counter). The third block has a block expression of (10) Therefore, replace with the C-type counter unit (i.e. 4/3-ary counter).

Step Five

Connect the individual counter units in cascade such that each counter unit receives the output of the preceding counter unit as its clock input. For a 23-ary counter, the output of the C-type counter unit of the third block is connected to the clock input or the A-type counter unit of the second block and the output of the A-type counter unit of the second block is connected to the clock input of the B-counter unit of the first block.

Step Six

Supply to each C-type counter unit a control signal for controlling the frequency dividing (demultiplication) ratio of the C-type counter. For each C-type counter, a corresponding AND gate is provided. The output of each AND gate serves as the control signal for the corresponding C-type unit. For each C-type counter the outputs of all succeeding counter units serve as inputs to the corresponding AND gate. In the case of a 23-ary counter, the output signal of the AND gate is supplied to the C-type counter unit of the third block. The inputs to the AND gate ar supplied by the outputs of the B-type counter unit of the first block and the A-type counter unit of the second block.

Asynchronous logical counter 1300 in accordance with the third embodiment of the invention is constructed based on the method set forth in Steps 1–6. In the foregoing method, a preceding counter unit refers to a corresponding higher numbered block and a succeeding counter unit refers to a corresponding lower numbered block. For example, the third block is associated with a preceding counter unit relative to the counter unit associated with the second block whereas the counter unit associated with the first block is a succeeding counter unit relative to the counter unit associated with the second block.

Counter 1300 of FIG. 13(a) includes a C-type counter unit 1306 having a clock input 1301(I) and an output 1304. Counter unit 1306 functions as a 4/3-ary counter. An A-type counter unit 1307 receives output 1304 as its clock input and functions as a 2-ary counter. A B-type counter unit 1308 receives an output 1305 or counter unit 1307 a its clock input and produces an output 1302 which serves as the output for counter 1300. An AND gate 1307 receives as inputs outputs 1305 and 1302. A control signal 1303(S) is produced by AND gate 1307 which is supplied to a NAND gate 1320 of counter unit 1306. Counter unit 1308 functions as a 3-ary counter. When control signal 1303 is at a low logic level and high logic level, counter unit 1306 functions as a 4-ary counter and a 3-ary counter, respectively.

Counter unit 1306 includes a flip-flop 1310 (FF0) having a $Q_0$ output and a flip-flop 1311 (FF1) having a $Q_1$ output. Counter unit 1307 includes a flip-flop 1312 (FF2) having a $Q_2$ output. Counter unit 1308 includes a flip-flop 1313 (FF3) having a $Q_3$ output and a flip-flop 1314 (FF4) having a $Q_4$ output.

As shown in FIG. 13(b)(1), counter unit 1306 functions as a 4-ary counter when control signal 1303(S)=0 and as a 3-ary counter when control signal 1303(S)=1. As shown in FIG. 13(b)(2) counter unit 1307 functions as a 2-ary counter at all times. Similarly, as shown in FIG. 13(b)(3), counter unit 1308 functions as a 3-ary counter regardless of the value of output $Q_2$ of counter unit 1307.

By combining the operations of counter units 1306, 1307 and 1308 as shown in FIGS. 13(b)(1), 13(b)(2) and 13(b)(3), the overall operation of counter 1300 has been tabularly illustrated in FIG. 13(c). C-type counter unit 1306 of the third block functions as a 4-ary counter from clock pulse $T_0$ to $T_{19}$, that is, until $Q_2=Q_4=1$. In other words, counter unit 1306 functions as a 4-ary counter when control signal 1303(S) is at a low logic level. Once control signal 1303(S) assumes a high logic level (i.e. $Q_4=Q_2=1$) counter unit 1306 functions as a 3-ary counter. Counter unit 1306 functions as a 3-ary counter for clock pulses $T_{20}$, $T_{21}$ and $T_{22}$.

Following clock pulse $T_{22}$, $Q_0=Q_1=0$. At the same time, output $Q_2$ assumes a low logic level since output $Q_1$, which serves as the clock input to counter unit 1307, now changes from a high logic level to a low logic level. Furthermore, following clock pulse $T_{22}$ output $Q_4$ assumes a low logic level since output $Q_2$ is now at a low logic level. $(Q_3, Q_4)$ changes from $(0,1)$ to $(0,0)$. Accordingly outputs $Q_0$–$Q_4$ are all at low logic levels, that is, all Q outputs of counter 1300 revert to the states represented by clock pulse $T_0$. Consequently, counter 1300 can assume 23 different combinations of outputs, that is, counter 1300 functions as a 23-ary counter.

FIGS. 14(a)(1), 14(a)(2) and 14(a)(3) illustrate the generalized equivalent logic configurations and symbolic block diagrams of the A-type counter unit, the B-type counter unit and the C-type counter unit, respectively. In FIG. 14(a)(1) the A-type counter unit is represented by a symbolic block 1401. The number 2 within the circle of symbolic block 1401 denotes that the A-type counter unit functions as a 2-ary counter having an input I and an output O. In FIG. 14(a)(2), the B-type counter unit is represented by a symbolic block 1403 and a generalized logic circuit 1408. The circle within block 1403 denotes that the B-type counter unit functions as a $(2^{n-1}+1)$-ary counter. In FIG. 14(a)(3) the C-type counter unit is represented by a symbolic block 1405 and a generalized logic circuit 1412. The expression within the circle of block 1405 denotes that the C-type counter unit functions as a $(2^n/2^{n-1}+1)$-ary counter. Block 1405 receives control signal 1303(S) and has an input I and an output O. When S=0, the C-type counter unit functions as a $2^n$-ary counter. When S=1, the C-type counter unit functions as a $(2^{n-1}+1)$-ary counter. Logic circuit 1408 of FIG. 14(a)(2) and logic circuit 1412 of FIG. 14(a)(3) include general circuit configurations for n bits.

FIGS. 15(a), 15(b), 15(c) and 15(d) illustrate the circuit configurations for n=2, 3, 4 and 5 based on the generalized circuit configuration of FIG. 14(a)(2), respectively. FIGS. 16(a), 16(b), 16(c) and 16(d) illustrate the circuit configurations for n=2, 3, 4 and 5 corresponding to the generalized circuit configuration of FIG. 14(a)(3), respectively.

Referring once again to FIG. 14(a)(2), circuit 1408 includes flip-flops $FF_0$–$FF_{n-1}$ having outputs $Q_0$, $Q_{n-1}$ and inputs $D_0$–$D_{n-1}$, respectively. When $Q_{n-1}=0$, $D_0=\overline{Q_0}\cdot\overline{Q_{n-1}}=\overline{Q_0}$ holds so that (n−1) flip-flops $FF_0$ through $FF_{n-2}$ form a ripple counter. Output O of counter 1408 increases its value by one for each clock pulse received at clock input I from $T_0$ to $T_{2^n-1}$ as illustrated in FIG. 14(b). Input $D_{n-1}$ assumes a value of "1" only when all outputs $Q_0$ through $Q_{n-2}$ are also at a value of "1", that is, at $T_{2^n-1}$. At that time, outputs $Q_0$ through $Q_{m-2}$ return to low logic levels. When output $Q_{n-1}=1$, at $T_{2^n-1}$, $D_0=\overline{Q_0}\cdot\overline{Q_{n-1}}=0$. Since input $D_{n-1}$ is also at a low logic level outputs $Q_0$ through $Q_{n-1}$ assume a low logic level immediately after clock pulse $T_{2^n-1}$. Therefore, after $T_{2^n-1}$, outputs $Q_0$–$Q_{n-1}$ of circuit 1408 assume the logic levels associated with clock pulse $T_0$. Accordingly, the circuit 1408 functions as a $(2^{n-1}+1)$-ary counter.

FIGS. 14(c)(1) and 14(c)(2) illustrate the operation or the C-type counter unit. Similar to circuit 1408, a circuit 1412 representing the generalized configuration of the C-type counter unit includes flip-flops $FF_0$–$FF_{n-1}$ having outputs $Q_0$–$Q_{n-1}$, and inputs $D_0$–$D_{n-1}$, respectively. S is the frequency dividing (demultiplication) ratio control input. When S=0:

$$D_0 = Q_0 \cdot (Q_{n-1} \cdot S) = Q_0, \text{ and}$$

$$D_{n-1} = \{(Q_0 \cdot Q_1 \cdot \ldots \cdot Q_{n-2}) \oplus Q_{n-1}\} \cdot (Q_{n-1} \cdot S)$$
$$= (Q_0 \cdot Q_1 \cdot \ldots \cdot Q_{n-2}) \oplus Q_{n-1}.$$

Circuit 1412 functions as a ripple counter. Output $Q_{n-1}$ or flip-flop $FF_{n-1}$ assumes a high logic level only when outputs $Q_0$ through $Q_{n-2}$ are also at a high logic level and S=0 as shown in FIG. 14(c)(1). In other words, circuit 1412 functions as a $2^n$-ary counter.

When S=1:

$$D_0 = Q_0 \cdot (Q_{n-1} \cdot S) = Q_0 \cdot Q_{n-1}, \text{ and}$$

$$D_{n-1} = \{(Q_0 \cdot Q_1 \cdot \ldots \cdot Q_{n-2}) \oplus Q_{n-1}\} \cdot (Q_{n-1} \cdot S)$$
$$= Q_0 \cdot Q_1 \cdot \ldots \cdot Q_{n-2} \cdot Q_{n-1}$$

However, since $Q_0 \cdot Q_1 \cdot \ldots \cdot Q_{n-2} \cdot \overline{Q}_{n-1}$ corresponds to a nonrealizable state:

$$D_{n-1} = Q_0 \cdot Q_1 \cdot \ldots \cdot Q_{n-2}$$

That is, when S=1, the C-type counter unit functions as a $(2^{n-1}+1)$-ary counter similar to the B-type counter unit and operates as illustrated in FIG. 14(c)(2).

As now can be readily appreciated, an asynchronous logical counter in accordance with the third embodiment of the invention is formed by combining the A-type counter units, B-type counter units and C-type counter units together based on the above method. As shown in FIGS. 17(a), 17(b), 17(c) and 17(d), additional alternative embodiments of the invention ranging from a 2-ary counter through a 32-ary counter are represented using the symbolic blocks of FIGS. 14(a)(1), 14(a)(2) and 14(a)(3). The counters shown in FIGS. 17(a)–17(d) are formed by using the foregoing six step method.

Figure 19:
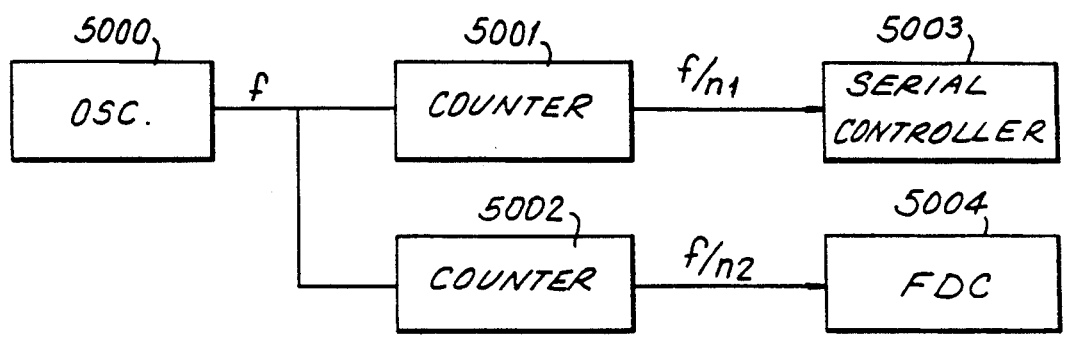
FIGS. 19 and 20 are block diagrams of two devices in accordance with the invention.
Figure 20:
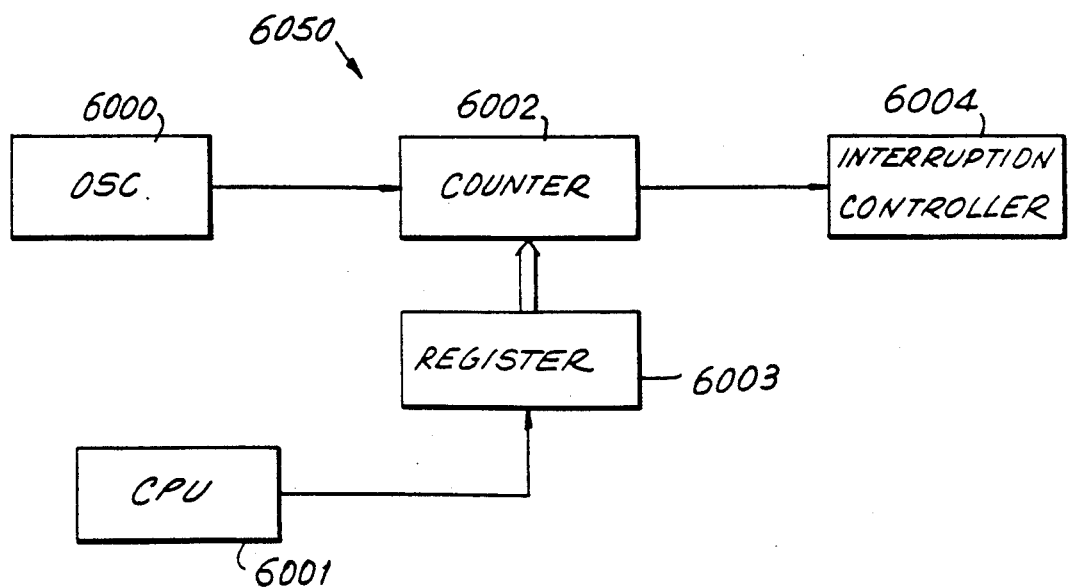
Figure 21A:
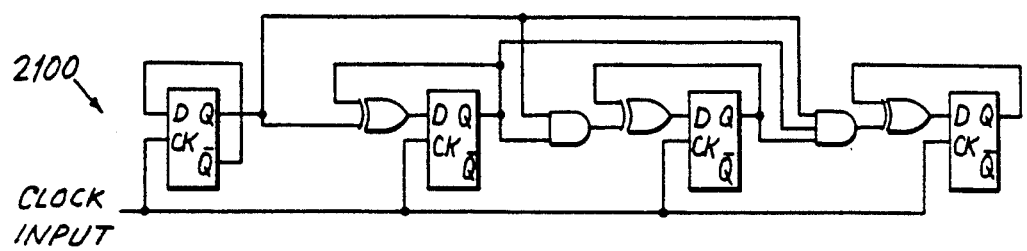
FIGS. 21(a) and 21(b) are logic circuits of a conventional synchronous counter and a conventional asynchronous counter.
Figure 21B:
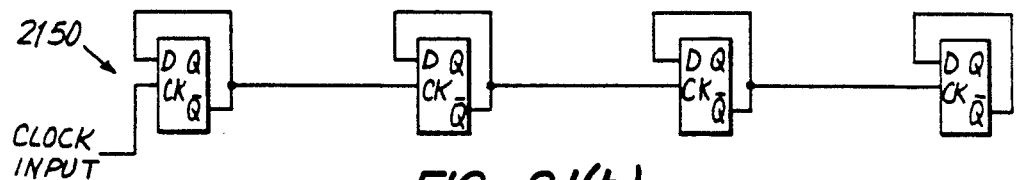

Applications of the three alternative counters shown in FIGS. 1, 9 and 13(a) are illustrated in FIGS. 19 and 20. FIG. 19 shows a system 5050 which includes an oscillator 5000 producing a signal having a frequency f which is supplied to a counter 5001 and a counter 5002 in accordance with the invention. Counter 5001 produces a signal having a frequency of $f/n_1$ which is supplied to a serial controller 5003. Counter 5002 produces a signal having a frequency $f/n_2$ which is supplied to a floppy disk controller (FDC) 5004. The signal supplied by counter 5001 and 5002 are used as timing signals for serial controller 5003 and FDC 5004. Alternatively, units such as a hard disk controller, CRT controller, LCD controller, etc. can be used in place of or in combination with serial controller 5003 and FDC 5004 to provide the required timing signals. As shown in FIG. 20, a system 6050 includes an oscillator 6000 which provides an oscillating signal to a programmable counter 6002 in accordance with the invention. Counter 6002 serves as a frequency divider providing an output signal to an interruption controller 6004. The frequency dividing ratio of counter 6002 is based on the value set in a register 6003 by a CPU 6001. Interruption controller 6004 provides various interruption signals of different periods.

In accordance with the invention, a counter having any desired frequency dividing ratio ca be designed by use of the systematic methods set forth herein. The number of transistors included in the counter is significantly reduced compared to conventional counters. The range of possible applications of the invention is extremely broad inasmuch as counters are widely used in a variety of controllers.

Since the counter in accordance with the invention requires far fewer transistors significant reductions in the cost of the counter can be realized. For example, a conventional counter using 140 transistors can be built using counter 1000 of FIG. 10 employing only 110 transistors. This is a 20% reduction in the number of transistors required. The operating frequency of the counter in accordance with the invention is also enhanced. More particularly, since the invention requires no actuation of a flip-flop by an inverted signal of a clock input, the operating (working) frequency of a counter in accordance with the invention such as counter 1000 of FIG. 10 is about two times that of a conventional counter Furthermore, the individual states of a counter in accordance with the invention are uniform in terms of length of time. No reset terminals are required for a counter in accordance with the invention in contrast to conventional counters. For example, counter 1000 of FIG. lo has no condition in which the output of any flip-flop assumes a low logic level for a long period of time and a high logic level for a short period of time.

Advantageously, a programmable counter in accordance with the invention can be caused to have any desired frequency division ratio by changing the setting value from an external source. Such a programmable counter can be widely used in timing circuits and the like. The asynchronous non-logical programmable counter in accordance with the invention therefore requires far fewer transistors and can assume a variety of different values other than $2^n$.

As shown in FIGS. 18(a) and 18(b) a comparison in the number of gates between counters in accordance with the invention and synchronous counters in accordance with the prior art are tabularly illustrated. For example, referring to a 23-ary counter, a conventional counter requires 53 gates whereas a counter 1300 of FIG. 13(a) requires only 38 gates. An approximate 30% reduction in the number of gates is achieved. In examining all of the counters (2-ary counter through 32-ary counter), an approximate 25% reduction on average in the number of gates is achieved by use of a counter in accordance with the invention as compared to a conventional counter.

Gate arrays, standard cells and the like are widely used in current electronic devices. A proportional relationship exists between the number of gates and the cost of a currently available electronic device. Consequently, the cost of a currently available electronic device can be reduced by approximately 25% by use of a counter in accordance with the invention. Still further, since a counter is one of the basic components for all electronic circuits and has a broad range of applications, a counter in accordance with the invention can have a significant impact on the electronic industry.

FIGS. 18(a) and 18(b) also illustrate the structure of the counter in accordance with FIGS. 14(a), 14(b) and 14(c). An N-ary counter (N=2 to 32) is formed by expressing N−1 in binary form, grouping the expressed bits into blocks based on each time that a "1" bit appears when examined from the low order side, defining each block by including only one "1" bit and replacing each block with either a A-type counter unit, B-type counter unit or C-type counter unit to form an overall counter.

It will thus be seen that the objects set forth above, and those made apparent from the preceding description, are efficiently attained and, since certain changes may be made in the above method and construction set forth without departing from the spirit and scope of the invention, it is intended that all matter contained in the above description and shown in the accompanying drawings shall interpreted as illustrative and not in a limiting sense.

It is also to be understood that the following claims are intended to cover all the generic and specific features of the invention herein described, and all statements of the scope of the invention which, as a matter of language, might be said to fall therebetween.

What is claimed is:

1. An asynchronous, nonlogical counter,
   preceding counter means having only two flip-flops, characterized by a frequency dividing ratio of less than five and operable for receiving a first clock signal and for producing a first output signal based on said frequency dividing ratio, said first output signal having a value based on a two, three or four value counting system;
   succeeding counter means having n flip-flops, characterized by an additional frequency dividing ratio of $2^n$ and operable for receiving a second clock signal based on said first output signal and for producing a second output signal based on said additional frequency dividing ratio, said second output signal having a value based on a $2^n$ counting system, wherein n is a natural number; and
   control means for producing a control signal based on said second output signal, said preceding counter means being sensitive to said control signal for varying said frequency dividing ratio.

2. The asysnchronous, nonlogical counter of claim 1, wherein said instructing signal includes n+1 bits and wherein said preceding counter means is responsive to the n+1 bit of the instructing signal.

3. The asynchronous, nonlogical counter of claim 1 in combination with an external instruction source which produces an instructing signal, wherein said preceding counter means is also responsive to said instructing signal for varying the frequency dividing ratio.

4. The asysnchronous, nonlogical counter of claim 3, wherein said instructing signal includes n+1 bits and wherein said preceding counter means is responsive to the n+1 bit of the instructing signal.

5. The asynchronous, nonlogical counter of claim 1, further including at least one additional succeeding counter means, each additional succeeding counter means for producing an additional output signal wherein said control means produces said control signal based on said second output signal and each additional output signal.

6. The asynchronous, nonlogical counter of claim 5, wherein said at least one additional succeeding counter means includes more than one additional succeeding counter means and wherein a first of the additional succeeding counter means receives a third clock signal based on said second output signal of said succeeding counter means and wherein each of the other additional succeeding counter means receives an associated clock signal based on one of said additional output signals.

7. The asynchronous, nonlogical counter of claim 3, further including at least one additional succeeding counter means, each additional succeeding counter means for producing an additional output signal wherein said control means produces said control signal based on said second output signal and each additional output signal.

8. The asynchronous, nonlogical counter of claim 7, wherein said at least one additional succeeding counter means includes more than one additional succeeding counter means and wherein a first of the additional succeeding counter means receives a third clock signal based on said second output signal of said succeeding counter means and wherein each of the other additional succeeding counter means receives an associated clock signal based on one of said additional output signals.

9. The asynchronous, nonlogical counter of claim 4, further including at least one additional succeeding counter means, each additional succeeding counter means for producing an additional output signal wherein said control means produces said control signal based on said second output signal and each additional output signal.

10. The asynchronous, nonlogical counter of claim 9, wherein said at least one additional succeeding counter means includes more than one additional succeeding counter means and wherein a first of the additional succeeding counter means receives a third clock signal based on said second output signal of said succeeding counter means and wherein each of the other additional succeeding counter means receives an associated clock signal based on one of said additional output signals.

11. The asynchronous, nonlogical counter of claim 1, wherein the preceding counter means includes logic means for varying the frequency dividing ration between ½ and ¼ based on said control signal.

12. The asynchronous, nonlogical counter of claim 3, wherein the preceding counter means includes logic means for varying the frequency dividing ratio between ⅓ and ¼ based on said control signal and said instructing signal.

13. The asynchronous, nonlogical counter of claim 5, wherein the preceding counter means includes logic means for varying the frequency dividing ratio between ⅓ and ¼ based on said control signal.

14. The asynchronous, nonlogical counter of claim 6, wherein the preceding counter means includes logic means for varying the frequency dividing ratio between ⅓ and ¼ based on said control signal.

15. The asynchronous, nonlogical counter of claim 1, wherein the preceding counter means includes logic means for varying the frequency dividing ratio between ½ and ⅓ based on said control signal.

16. The asynchronous, nonlogical counter of claim 3, wherein the succeeding counter means is a ripple counter.

17. The asynchronous, nonlogical counter of claim 5, wherien the succeeding counter means is a ripple counter.

18. An asynchronous, nonlogical counter, comprising:

preceding counter means having only two flip-flops, characterized by a frequency dividing ratio of less than five and operable receiving a first clock signal and for producing a first output signal based on said frequency dividing ratio, said first output signal having a value based on a two, three or four value counting system;

succeeding counter means having n flip-flops, characterized by an additional frequency dividing ratio of $2^n$ and operable for receiving a second clock signal based on said first output signal and for producing a second output signal based on said additional frequency dividing ratio, said second output signal having a value based on a $2^n$ counting system, wherein n is a natural number;

receiving means for delivering a portion of an instructing signal representative of the frequency ratio of said preceding counter means; and comparison means for comparing said portion of the instructing signal to the second output signal and producing a control signal based on the comparison, said preceding counter means being responsive to said control signal and the remaining portion of the instructing signal for varying said frequency dividing ratio whereby the overall frequency dividing ratio of the counter is based on said instructing signal.

19. The asynchronous, nonlogical counter of claim 18, wherein the instructing signal includes (n+1) bits and said second output signal includes n bits, each of said n bits corresponding to the output of one of said n flip-flops said comparison means including means for comparing the magnitudes of n bits of said instructing signal with the n bits of said second output signal.

20. The asynchronous, nonlogical counter of claim 19, wherein the highest order of the (n+1) bits of said receiving signal serves as the remaining portion of the instructing signal.

21. The asynchronous, nonlogical counter of claim 18, wherein the succeeding counter means is a ripple counter.

22. The asynchronous, nonlogical counter of claim 20, wherein the succeeding counter means is a ripple counter.

23. An asynchronous logical counting device, comprising:

at least two counters connected in cascade, each counter selected from a group consisting of an A-type unit, a B-type unit and a C-type unit, wherein at least one of said selected counters is said C-type unit;

the A-type unit including an input and an output and characterized by a frequency dividing ratio of 2;

the B-type unit including an input and an output and characterized by a frequency dividing ratio of $2^{n-1}+1$ where n is an integer equal to or greater than 2;

the C-type unit including an input and an output and characterized by a frequency dividing ratio which varies between $2^{n-1}+1$ and $2^n$; and AND gate means associated with each C-type unit and for producing a control signal, each C-type unit being responsive to the control signal produced by the associated AND gate means for varying the frequency dividing ratio between $2^{n-1}+1$ and $2^n$;

wherein the input of each unit is connected to the output of the preceding unit, the control signal produced by each AND gate means is based on the outputs of each unit which succeeds the associated C-type unit and an output from each unit serves as part of an output signal for the logical counting device.

24. The asynchronous logical counting device of claim 23, wherein each B-type unit includes n flip-flops.

25. The asynchronous logical counting device of claim 24, wherein each flip-flop of each B-type unit has a clock input $CK_i$, a D input $D_i$, a Q output $Q_i$ and a $\overline{Q}$ output $\overline{Q}_i$ where i is a non-negative integer; the input and output of each B-type unit are represented by I and O, respectively; and wherein the flip-flop of each B-type unit are connected together as follows:

$CK_0 = CK_{n-1} = \overline{I}$, that is clock inputs $CK_0$ and $CK_{n-1}$ are connected to an inverted input $\overline{I}$;

$D_0 = (Q_0 \cdot Q_{n-1})$, that is, a logic gate supplies an output of $Q_0 \cdot Q_{n-1}$ to input $D_0$;

$D_{n-1} = Q_0 \cdot Q_1 \cdot \ldots \cdot Q_{n-2}$, that is, a logic gate supplies an output of $Q_0 \cdot \ldots \cdot Q_{n-2}$ to input $D_{n-1}$; and $O = Q_{n-1}$, that is, output O is connected to output $Q_{n-1}$; and for $1 \geq i \leq n-2$;

$CK_i = Q_{i-1}$, that is, clock input $CK_i$ is connected to output $Q_{i-1}$; and $D_i = Q_i$, that is, input $D_i$ is connected to output $Q_i$.

26. The asynchronous logical counter of claim 23, wherein each C-type unit includes n flip-flops.

27. The asynchronous logical counter of claim 26, wherein each flip-flop of each C-type unit has a clock input $CK_i$, a D input $D_i$, a Q output $Q_i$ and a $\overline{Q}$ output $\overline{Q}_i$ where i is a non-negative integer; the clock input, output and frequency dividing ratio input of each C-type unit are represented by I, O and S, respectively; and wherein the flip-flops of each C-type unit are connected together as follows:

$CK_0 = CK_{n-1} = \overline{I}$, that is clock inputs $CK_o$ and $CK_{n-1}$ are connected to an inverted input $\overline{I}$;

$D_0 = \overline{Q_0} \cdot (\overline{S} \cdot \overline{Q}_{n-1})$, that is, a logic gate supplies an output of $\overline{Q_0} \cdot (\overline{S} \cdot \overline{Q}_{n-1})$ to input $D_0$;

$D_{n-1} = (Q_{n-1} \oplus Q_0 \cdot Q_1 \cdot \ldots \cdot Q_{n-2}) \cdot (\overline{S} \cdot \overline{Q}_{n-1})$, that is, a logic gate supplies an output of $(Q_{n-1} \oplus Q_0 \cdot Q_1 \cdot \ldots \cdot Q_{n-2}) \cdot (\overline{S} \cdot \overline{Q}_{n-1})$ to input $D_{n-1}$; and $O = Q_{n-1}$, that is, output O is connected to output $Q_{n-1}$; and for $1 \leq i \leq n-2$:

$CK_i = Q_{i-1}$, that is, clock input $CK_i$ is connected to output $Q_{i-1}$; and $D_i = Q_i$, that is, input $D_i$ is connected to output $Q_i$.

28. The asynchronous logical counter of claim 24, wherein each C-type unit includes n flip-flops.

29. The asynchronous logical counter of claim 28, wherein each flip-flop of each C-type unit has a clock input $CK_i$, a D input $D_i$, a Q output $Q_i$ and a $\overline{Q}$ output $\overline{Q}_i$ where i is a non-negative integer; the clock input, output and frequency dividing ratio input of each C-type unit are represented by I, O and S, respectively; and wherein the flip-flops of each C-type unit are connected together as follows:

$CK_0 = CK_{n-1} = \overline{I}$, that is clock inputs $CK_0$ and $CK_{n-1}$ are connected to an inverted input $\overline{I}$;

$D_0 = Q_0 \cdot (\overline{S} \cdot \overline{Q}_{n-1})$, that is, a logic gate supplies an output of $Q_0 \cdot (\overline{S} \cdot \overline{Q}_{n-1})$ to input $D_0$;

$D_{n-1} = (Q_{n-1} \oplus Q_0 \cdot Q_1 \cdot \ldots \cdot Q_{n-2}) \cdot (\overline{S} \cdot \overline{Q}_{n-1})$, that is, a logic gate supplies an output $(Q_{n-1} \oplus Q_0 \cdot Q_1 \cdot \ldots \cdot Q_{n-2}) \cdot (\overline{S} \cdot \overline{Q}_{n-1})$ to input $D_{n-1}$; and $O = Q_{n-1}$, that is, output O is connected to output $Q_{n-1}$; and for $1 \leq i \leq n-2$;

$CK_i = Q_{i-1}$, that is, clock input $CK_i$ is connected to output $Q_{i-1}$; and $D_i = \overline{Q}_i$, that is, input $D_i$ is connected to output $\overline{Q}_i$.

30. The asynchronous logical counter of claim 25, wherein each C-type unit includes n flip-flops.

31. The asynchronous logical counter of claim 30, wherein each flip-flop of each C-type unit has a clock input $CK_i$, a D input $D_1$, a Q output $Q_i$ and a $\overline{Q}$ output $\overline{Q}_i$ where i is a non-negative integer; the clock input, output and frequency dividing ratio input of each C-type unit are represented by I, O and S, respectively; and wherein the flip-flops of each C-type unit are connected together as follows:

$CK_0 = CK_{n-1} = \overline{I}$, that is clock inputs $CK_0$ and $CK_{n-1}$ are connected to an inverted input $\overline{I}$;

$D_0 = \overline{Q_0} \cdot (\overline{S} \cdot \overline{Q}_{n-1})$, that is, a logic gate supplies an output of $\overline{Q_0} \cdot (\overline{S} \cdot \overline{Q}_{n-1})$ to input $D_0$;

$D_{n-1} = (Q_{n-1} \oplus Q_0 \cdot Q_1 \cdot \ldots \cdot Q_{n-2}) \cdot (\overline{S} \cdot \overline{Q}_{n-1})$, that is, a logic gate supplies an output $(Q_{n-1} \oplus Q_0 \cdot Q_1 \cdot \ldots \cdot Q_{n-2}) \cdot (\overline{S} \cdot \overline{Q}_{n-1})$ to input $D_{n-1}$; and $O = Q_{n-1}$, that is, output O is connected to output $Q_{n-1}$; and for $1 \leq i \leq n-2$;

$CK_i = \overline{Q}_{i-1}$, that is, clock input $CK_i$ is connected to output $\overline{Q}_{i-1}$; and $D_i = \overline{Q}_i$, that is, input $D_i$ is connected to output $\overline{Q}_i$.

32. An electronic device including an asynchronous, nonlogical counter, comprising:

oscillation means for supplying an input signal to the counter; and an external unit for receiving the output signal from the counter for use as a timing signal;

said counter including:

preceding counter means having only two flip-flops, characterized by a frequency dividing ratio of less than five and operable for receiving a first clock signal and for producing a first output signal based on said frequency dividing ratio, said first output signal having a value based on a two, three or four value counting system;

succeeding counter means having n flip-flops, characterized by an additional frequency dividing ration of $2^n$ and operable for receiving a second clock signal based on said first output signal and for producing a second output signal based on said additional frequency dividing ratio, said second output signal having a value based on a $2^n$ counting system, wherein n is a natural number; and control means for producing a control signal based on said second output signal, said preceding counter means being responsive to said control signal for varying said frequency dividing ratio.

33. The electronic device of claim 31, further including an external instruction source which produces an instructing signal, wherein said preceding counter means is also responsive to said instructing signal for varying the frequency dividing ratio.

34. The electronic device of claim 33, wherein said instructing signal includes n+1 bits and wherein said preceding counter means is responsive to the n+1 bit of the instructing signal.

35. An electronic device including an asynchronous, nonlogical counter which produces an output signal, comprising:

oscillation means for supplying an input signal to the counter; and an external unit for receiving the output signal from the counter for use as a timing signal;

said counter including:

preceding counter means having only two flip-flops, characterized by a frequency dividing ratio of less than five and operable for receiving a first clock signal and for producing a first output signal based on said frequency dividing ratio, said first output signal having a value based on a two, three or four value counting system;

succeeding counter means having n flip-flops, characterized by an additional frequency dividing ratio of $2^n$ and operable for receiving a second bit signal based on said first output signal and for producing a second output signal based on said additional frequency dividing ratio, said second output signal having a value based on a $2^n$ counting system, wherein n is a natural number;

receiving means for delivering a portion of an instructing signal representative of the frequency ratio said preceding counter means; and comparison means for comparing said portion of the instructing signal to the second output signal and producing a control signal based on the comparison, said preceding counter means being responsive to said control signal and the remaining portion of the instructing signal for varying said frequency dividing ratio whereby the overall frequency dividing ratio of the counter is based on said instructing signal.

36. The electronic device counter of claim 35, wherein the instruction signal includes (n+1) bits and said second output signal includes n bits, each of said n bits corresponding to the output of one of said n flip-flops, said comparison means including means for comparing the magnitude of n bits of said instruction signal with the n bits of said second output signal.

37. The electronic device of claim 36, wherein the highest order of the (n+1) bits of said instruction signal serves as said remaining portion of the instructing signal.

38. The electronic device of claim 35, wherein the succeeding counter means is a ripple counter.

39. The electronic device of claim 37, wherein the succeeding counter means is a ripple counter.

40. An electronic device including an asynchronous logical counting device which produces an output signal, comprising:

oscillation means for supplying an input signal to the counter; and an external unit for receiving the output signal from the counter for use as a timing signal;

said counter including:

at least two counters connected in cascade, each selected from a group consisting of an A-type unit, a B-type unit and a C-type unit wherein at least one of said selected counters is said C-type unit;

the A-type unit including an input and an output and characterized by a frequency dividing ratio of 2;

the B-type unit including an input and an output and characterized by a frequency dividing ratio of $2^{n-1}+1$ where n is an integer equal to or greater than 2;

the C-type unit including an input and an output and characterized by a frequency dividing ratio which varies between $2^{n-1}+1$ and $2^n$; and AND gate means associated with each C-type unit and for producing a control signal, each C-type unit being responsive to the control signal produced by the associated AND gate means for varying the frequency dividing ratio between $2^{n-1}+1$ and $2^n$;

wherein the input of each unit is connected to the output of the preceding unit, the control signal produced by each AND gate means is based on the outputs of each unit which succeeds the associated C-type unit and wherein an output from each unit serves as part of an output signal for the logical counting device.

41. A method of constructing an asysnchronous counting device operable for producing M count values comprising:

selecting a first counter having n flip-flops, n being a natural number;

expressing M−1 in binary notation as follows:

$$M-1 = a_0 \times 2^0 + a_1 \times 2^1 + \ldots \\ a_{n-1} \times 2^{n-1} + a_n \times 2^2 + a_{n+1} \times 2^{n+1}$$

where $a_{n+1}=0$;

determining whether a 0 or 1 is associated with each of $a_0 - a_n$;

selecting a second counter having a frequency dividing ratio which varies between ¼ and ½ when $a_n = 1$ and which varies between ⅛ and ¼ when $a_n=0$;

selecting a control circuit which includes a $(K+1)/2^n$ mode wherein:

$$K = a_0 \times 2^0 + a_1 \times 2^1 + \ldots + a_n \times 2^{n-1}; \text{ and}$$

connecting the first circuit and second circuit in cascade with the clock signal of the first counter based on the output produced by the second counter, the output of the first counter connected to the input of the control circuit and the output of the control circuit supplied to the second counter whereby the frequency dividing ratio of the second counter varies based on the output of the control circuit.

42. A method of constructing an asynchronous counting device operable for producing N count values, comprising:

expressing N in binary form;

segregating the binary expression into p blocks (p being a natural number), each block including only one bit having a value of "1", said segregation beginning with the lowest ordered bit such that a first block includes the highest order bit and the $p^{th}$ block includes the lowest order bit;

selecting a first counter having two count values when the first block contains only the highest order bit;

selecting a first counter having $(2^{n-1}+1)$ count values when the first block includes at least two bits where n=number of bits in the first block;

for each remaining block which includes only one bit, selecting an additional counter having two count values;

for each remaining block which includes at least two bits, selecting an additonal counter having a frequency dividing ratio which varies between $2^m$ and $2^{m-1}+1$ where m is the number of bits of the remaining block; and connecting each of the counters in cascade wherein the output of the counter associated with the $p^{th}$ block is connected to input of the counter associated with the $(p-1)^{th}$ block; such connections of counters continuing based on descending block order such that the output of the counter associated with the first block remains unconnected.

* * * * *